(12) United States Patent
Tamura et al.

(10) Patent No.: US 12,040,374 B2
(45) Date of Patent: Jul. 16, 2024

(54) SEMICONDUCTOR DEVICE

(71) Applicant: ROHM CO., LTD., Kyoto (JP)

(72) Inventors: Kazuhiro Tamura, Kyoto (JP); Yusuke Nishida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 150 days.

(21) Appl. No.: 17/535,079

(22) Filed: Nov. 24, 2021

(65) Prior Publication Data
US 2022/0181461 A1 Jun. 9, 2022

(30) Foreign Application Priority Data

Dec. 4, 2020 (JP) ................................ 2020-202209

(51) Int. Cl.
H01L 29/49 (2006.01)
H01L 27/088 (2006.01)

(52) U.S. Cl.
CPC ........ *H01L 29/4916* (2013.01); *H01L 27/088* (2013.01)

(58) Field of Classification Search
CPC ......... H01L 29/66545; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878; H01L 23/5283; H01L 23/53266; H01L 27/0924; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/66636; H01L 29/7851; H01L 29/66795;
(Continued)

(56) References Cited

U.S. PATENT DOCUMENTS 4,224,733 A * 9/1980 Spadea ........... H01L 21/823857
257/E21.639
5,144,447 A * 9/1992 Akimoto ............. H04N 25/573
348/E3.018
(Continued)

*Primary Examiner* — Moin M Rahman
(74) *Attorney, Agent, or Firm* — Rabin & Berdo, P.C.

(57) ABSTRACT

There is provided a semiconductor device including: a chip including a main surface; and a first transistor formed in the chip, wherein the first transistor includes: a first drain region of a first conductive type that is formed on a surface layer portion of the main surface; a first source region of the first conductive type that is formed on the surface layer portion of the main surface at an interval from the first drain region and partitions a first channel region having a first channel length L1 in a region between the first source region and the first drain region; a first gate insulating film that covers the first channel region; and a first gate electrode that contains polysilicon and is formed on the first gate insulating film.

19 Claims, 15 Drawing Sheets

(58) Field of Classification Search
CPC . H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/485; H01L 29/41775; H01L 29/42324; H01L 29/4234; H01L 21/31111; H01L 21/31155; H01L 29/40114; H01L 29/40117; H01L 29/7883; H01L 21/76831; H01L 21/76805; H01L 29/78; H01L 21/02554; H01L 21/02595; H01L 29/04; H01L 29/0634; H01L 29/16; H01L 29/22; H01L 29/4916; H01L 29/66666; H01L 29/66969; H01L 29/7827; H01L 29/78642; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H10B 69/00

See application file for complete search history.

(56) References Cited

U.S. PATENT DOCUMENTS

| | | | |
|---|---|---|---|
| 6,097,070 A * | 8/2000 | Mandelman | H01L 21/28167 257/E29.264 |
| 7,808,387 B1 | 10/2010 | Kuhn | |
| 2006/0180868 A1* | 8/2006 | Maciejewski | H01L 29/66136 257/369 |
| 2009/0278167 A1* | 11/2009 | Ozoe | H01L 24/97 257/676 |

* cited by examiner

SEMICONDUCTOR DEVICE

CROSS-REFERENCE TO RELATED APPLICATION

This application is based upon and claims the benefit of priority from Japanese Patent Application No. 2020-202209, filed on Dec. 4, 2020, the entire contents of which are incorporated herein by reference.

TECHNICAL FIELD

The present disclosure relates to a semiconductor device.

BACKGROUND

A related art discloses a substrate and a semiconductor device including a transistor formed above the substrate. The transistor includes an insulating layer, a gate, an n-type drain, and an n-type source. The insulating layer covers a portion of the surface region of the substrate. The gate is located above the insulating layer. The gate includes a central region in which p-type impurities are introduced, and an outer region in which n-type impurities are introduced. The drain and the source are formed on the end portion sides of the gate in the surface region of the substrate, respectively. The central region of the gate forms the effective gate length of the transistor. The outer region of the gate is a region that occurs during drain and source formation, and is not required for transistor function.

SUMMARY

Some embodiments of the present disclosure provide a semiconductor device capable of improving accuracy of a gate threshold voltage.

According to one embodiment of the present disclosure, there is provided a semiconductor device including: a chip including a main surface; and a first transistor formed in the chip, wherein the first transistor includes: a first drain region of a first conductive type that is formed on a surface layer portion of the main surface; a first source region of the first conductive type that is formed on the surface layer portion of the main surface at an interval from the first drain region and partitions a first channel region having a first channel length L1 in a region between the first source region and the first drain region; a first gate insulating film that covers the first channel region; a first gate electrode that contains polysilicon and is formed on the first gate insulating film; a first region of the first conductive type that is formed in a peripheral portion of the first gate electrode; and a second region of a second conductive type that is formed in an inner portion of the first gate electrode and has a first gate length LG1 equal to or larger than the first channel length L1 (L1≤LG1).

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
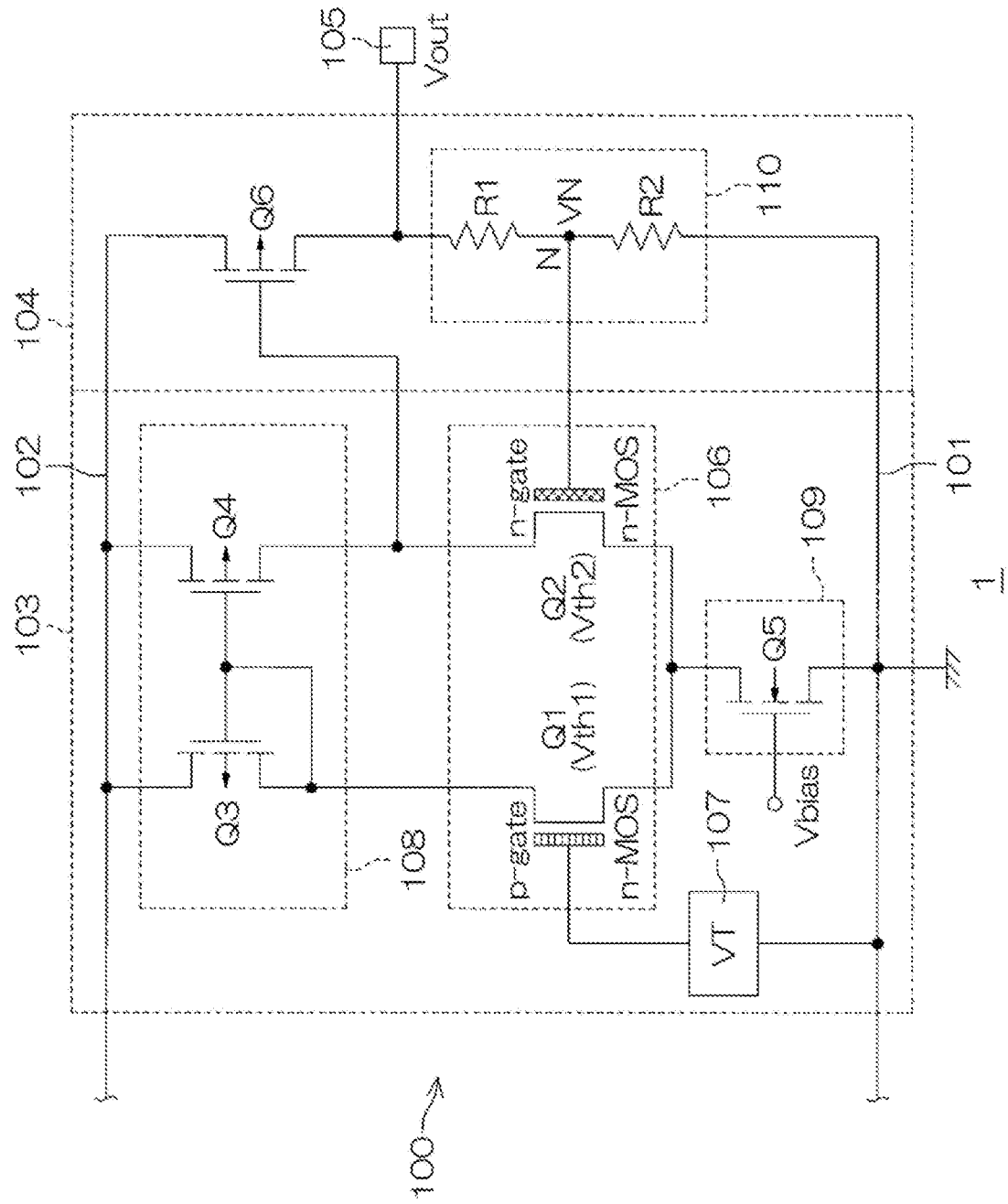
FIG. 1 is a circuit diagram showing an electric circuit included in a semiconductor device according to a first embodiment of the present disclosure.

Embodiments of the present disclosure will be now described in detail with reference to the accompanying drawings. FIG. 1 is a circuit diagram showing an electric circuit included in a semiconductor device 1 according to a first embodiment of the present disclosure. Referring to FIG. 1, the semiconductor device 1 includes a constant voltage generator 100 using a work function difference voltage. The constant voltage generator 100 includes a low potential wiring 101, a high potential wiring 102, a differential circuit 103, an output circuit 104, and an output terminal 105. A low potential (for example, ground potential) is applied to the low potential wiring 101, and a high potential (for example, power supply potential) based on the low potential is applied to the high potential wiring 102.

The differential circuit 103 includes a differential stage 106, a constant voltage source 107, a current mirror stage 108, and a constant current source 109. The differential stage 106 is interposed between the low potential wiring 101 and the high potential wiring 102. The differential stage 106 includes a first transistor Q1 and a second transistor Q2 that forms differential connection with the first transistor Q1. The differential stage 106 may be referred to as a "differential pair." In this embodiment, the first transistor Q1 and the second transistor Q2 are each composed of an npn-type (first polarity type) MISFET (Metal Insulator Semiconductor Field Effect Transistor) of an enhancement type.

The first transistor Q1 and the second transistor Q2 each include a drain, a source, and a gate. The gate of the first transistor Q1 is composed of a p-gate containing p-type impurities as main impurities. The gate of the second transistor Q2 is composed of an n-gate containing n-type impurities as main impurities. The first transistor Q1 has a first gate threshold voltage Vth1, and the second transistor Q2 has a second gate threshold voltage Vth2 (Vth1≠Vth2) different from the first gate threshold voltage Vth1.

The first gate threshold voltage Vth1 is determined by the work function of the p-gate, and the second transistor Q2 is determined by the work function of the n-gate. Specifically, the second gate threshold voltage Vth2 is less than the first gate threshold voltage Vth1 (Vth2<Vth1). A gate threshold voltage difference ΔVth (=Vth1−Vth2) between the first gate threshold voltage Vth1 and the second gate threshold voltage Vth2 has a negative temperature characteristic depending on a band gap voltage in a sub-threshold region.

The constant voltage source 107 is electrically connected to the p-gate of the first transistor Q1 and applies a constant voltage VT to the p-gate of the first transistor Q1. It is preferable that the constant voltage source 107 includes a PTAT (Proportional To Absolute Temperature) voltage source, has a positive temperature characteristic, and generates the constant voltage VT proportional to the absolute temperature. In this case, the constant voltage source 107 is configured (adjusted) so that the gate threshold voltage difference ΔVth having a negative temperature characteristic is complemented by the constant voltage VT having the positive temperature characteristic.

The constant voltage source 107 may consist of a variable resistor configured to adjust a resistance value. For example, the variable resistor may include a series circuit including a plurality of resistors, and a plurality of fuses connected in parallel to the resistors. In this case, the resistance value of the variable resistor is adjusted by cutting the fuses. The fuses may be configured to be fuse-melted by a laser beam.

The current mirror stage 108 is interposed between the high potential wiring 102 and the differential stage 106. In this embodiment, the current mirror stage 108 includes a first load transistor Q3 and a second load transistor Q4 that forms current mirror connection with the first load transistor Q3. The current mirror stage 108 may be referred to as a "current mirror pair." The current mirror stage 108 forms a current mirror type differential transistor circuit, together with the differential stage 106. In this embodiment, the first load transistor Q3 and the second load transistor Q4 are each composed of a pnp-type (second polar type) MISFET of an enhancement type. The first load transistor Q3 and the second load transistor Q4 each include a drain, a source, and a gate.

The source of the first load transistor Q3 is electrically connected to the high potential wiring 102. The drain of the first load transistor Q3 is electrically connected to the drain of the first transistor Q1. The gate of the first load transistor Q3 is short-circuited to the drain of the first load transistor Q3 to form diode connection with the drain. The source of the second load transistor Q4 is electrically connected to the high potential wiring 102. The drain of the second load transistor Q4 is electrically connected to the drain of the second transistor Q2. The gate of the second load transistor Q4 is electrically connected to the gate of the first load transistor Q3.

The constant current source 109 is interposed between the low potential wiring 101 and the differential stage 106. The constant current source 109 includes a bias transistor Q5. The bias transistor Q5 is composed of an npn-type MISFET of an enhancement type. The bias transistor Q5 includes a drain, a source, and a gate. The drain of the bias transistor Q5 is electrically connected to the source of the first transistor Q1 and the source of the second transistor Q2. The source of the bias transistor Q5 is electrically connected to the low potential wiring 101. A bias voltage Vbias is applied to the gate of the bias transistor Q5.

The output circuit 104 includes an output transistor Q6 and a resistance voltage divider circuit 110. In this embodiment, the output transistor Q6 is composed of a pnp-type MISFET of an enhancement type. The output transistor Q6 includes a drain, a source, and a gate. The source of the output transistor Q6 is electrically connected to the high potential wiring 102. The gate of the output transistor Q6 is electrically connected to the drain of the second transistor Q2 and the drain of the second load transistor Q4.

The resistance voltage divider circuit 110 is interposed between the low potential wiring 101 and the output transistor Q6. The resistance voltage divider circuit 110 includes a first resistor R1, a second resistor R2, and a voltage dividing node N. One end of the first resistor R1 is electrically connected to the drain of the output transistor Q6. One end of the second resistor R2 is electrically connected to the other end of the first resistor R1, and the other end of the second resistor R2 is electrically connected to the low potential wiring 101.

The resistance ratio (=(R1+R2)/R2) of the first resistor R1 and the second resistor R2 is arbitrary. One or both of the first resistor R1 and the second resistor R2 may be configured by the variable resistor as described above. The voltage dividing node N is composed of a connecting portion of the first resistor R1 and the second resistor R2 and is electrically connected to the n-gate of the second transistor Q2. A node voltage VN of the voltage dividing node N is a value (ΔVth+VT) obtained by adding the gate threshold voltage difference ΔVth and the constant voltage VT.

The output terminal 105 is electrically connected to the drain of the output transistor Q6 and outputs an output voltage Vout. The output voltage Vout is a value obtained by multiplying the node voltage VN (=ΔVth+VT) by the resistance ratio (=(R1+R2)/R2) of the resistance voltage divider circuit 110. The constant voltage generator 100 does not necessarily have to include the resistance voltage divider circuit 110, and may adopt the resistance voltage divider circuit 110 not including the resistance voltage divider circuit 110.

In this case, the output terminal 105 outputs the output voltage Vout which is a value (ΔVth+VT) obtained by adding the gate threshold voltage difference ΔVth and the constant voltage VT. In this way, the constant voltage generator 100 generates the output voltage Vout corresponding to the work function difference voltage (the gate threshold voltage difference ΔVth). That is, the output accuracy of the constant voltage generator 100 is improved by improving the accuracy of the first gate threshold voltage Vth1 and the accuracy of the second gate threshold voltage Vth2.

Figure 2:
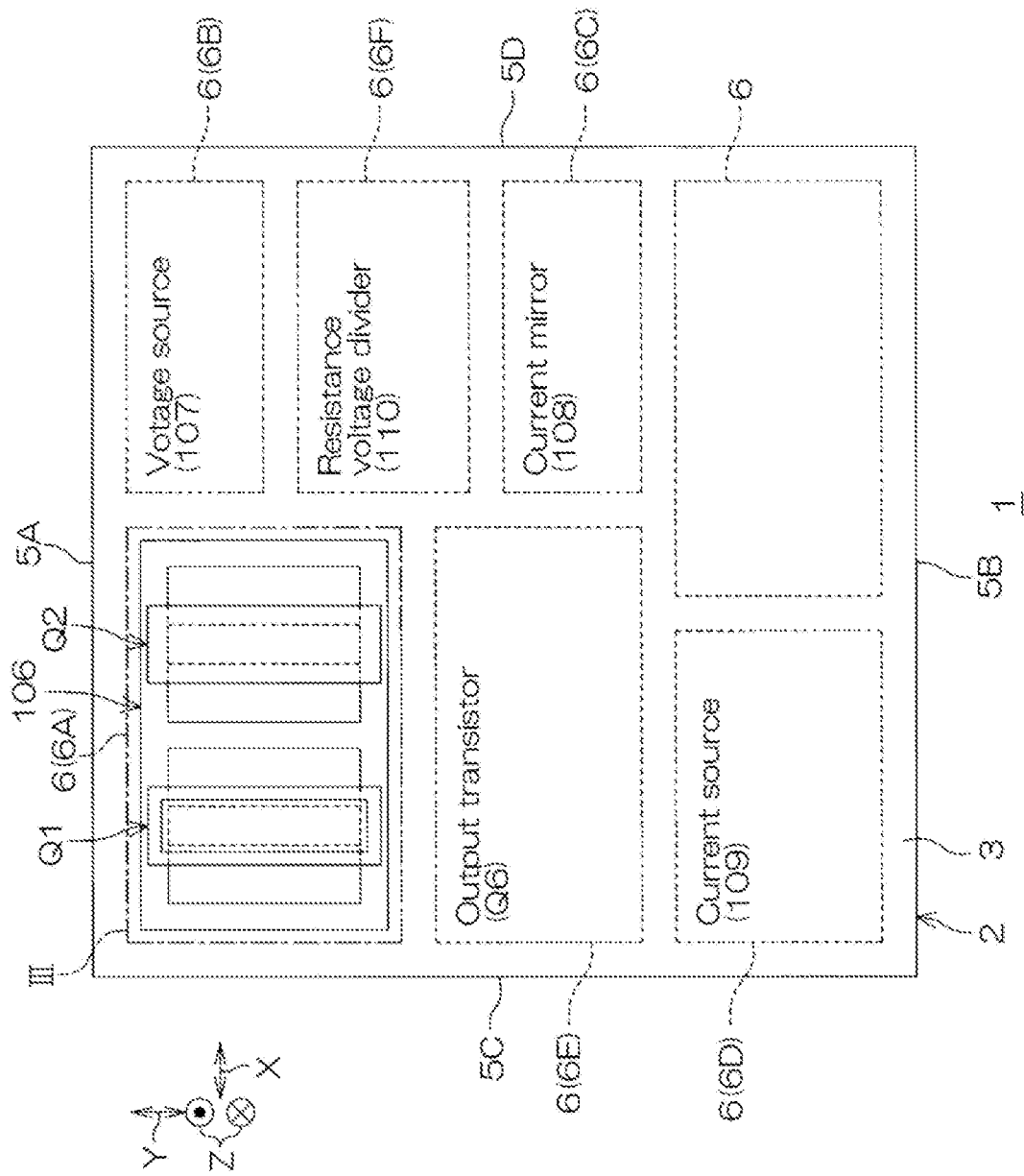
FIG. 2 is a schematic plan view showing the semiconductor device shown in FIG. 1.
Figure 3:
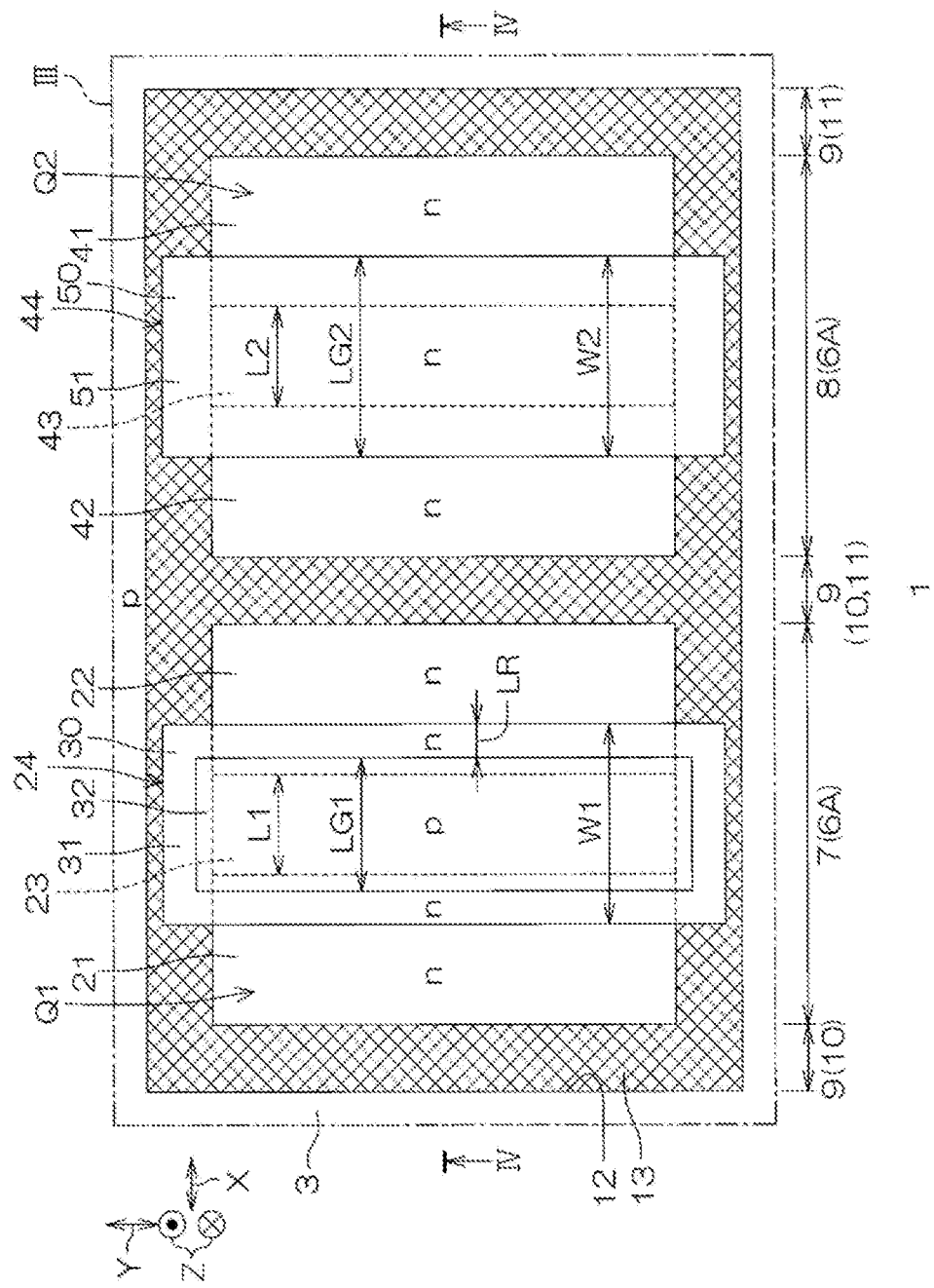
FIG. 3 is an enlarged view of a region III shown in FIG. 2.
Figure 4:
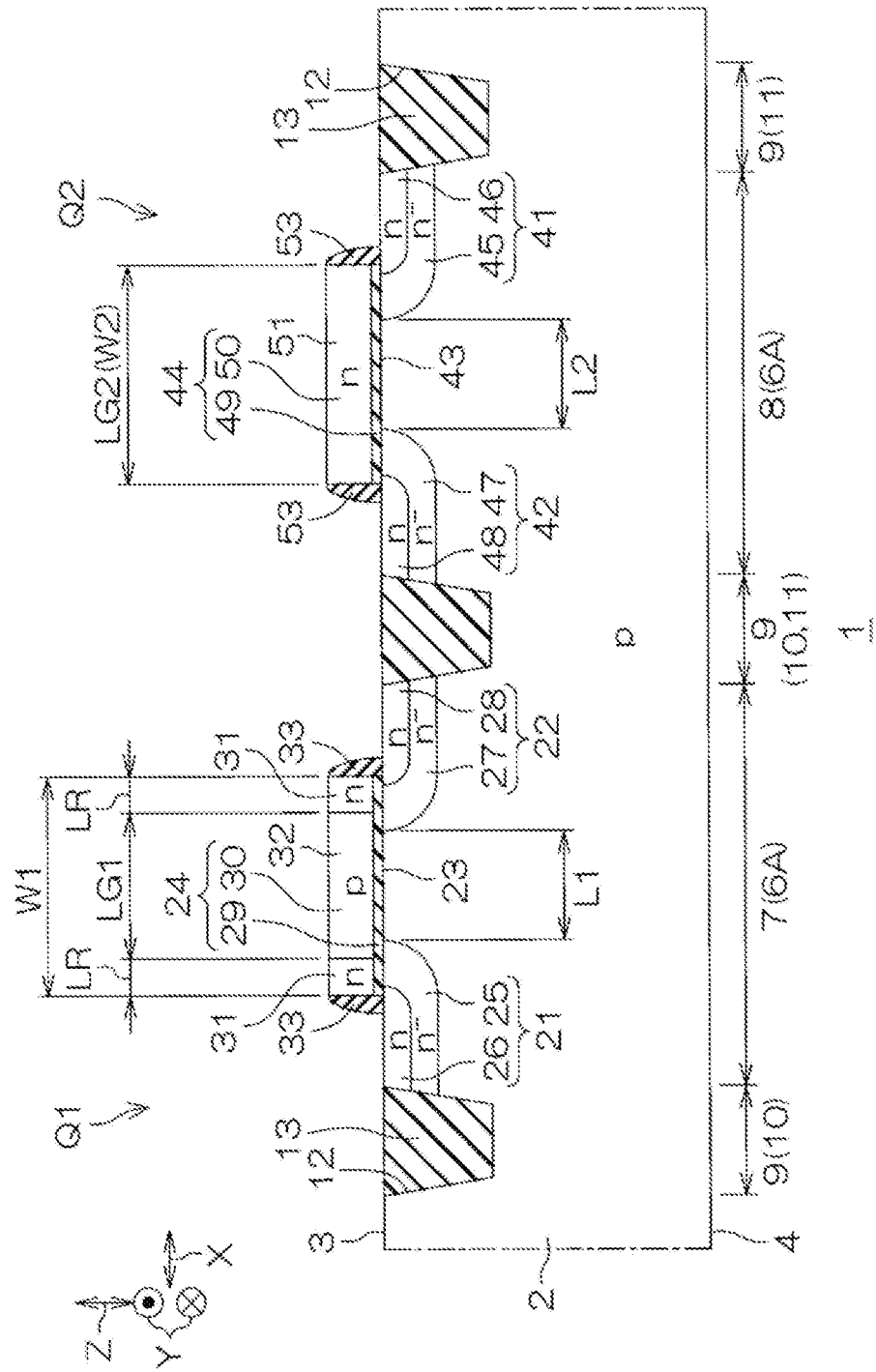
FIG. 4 is a cross-sectional view taken along line IV-IV shown in FIG. 3.
Figure 5:
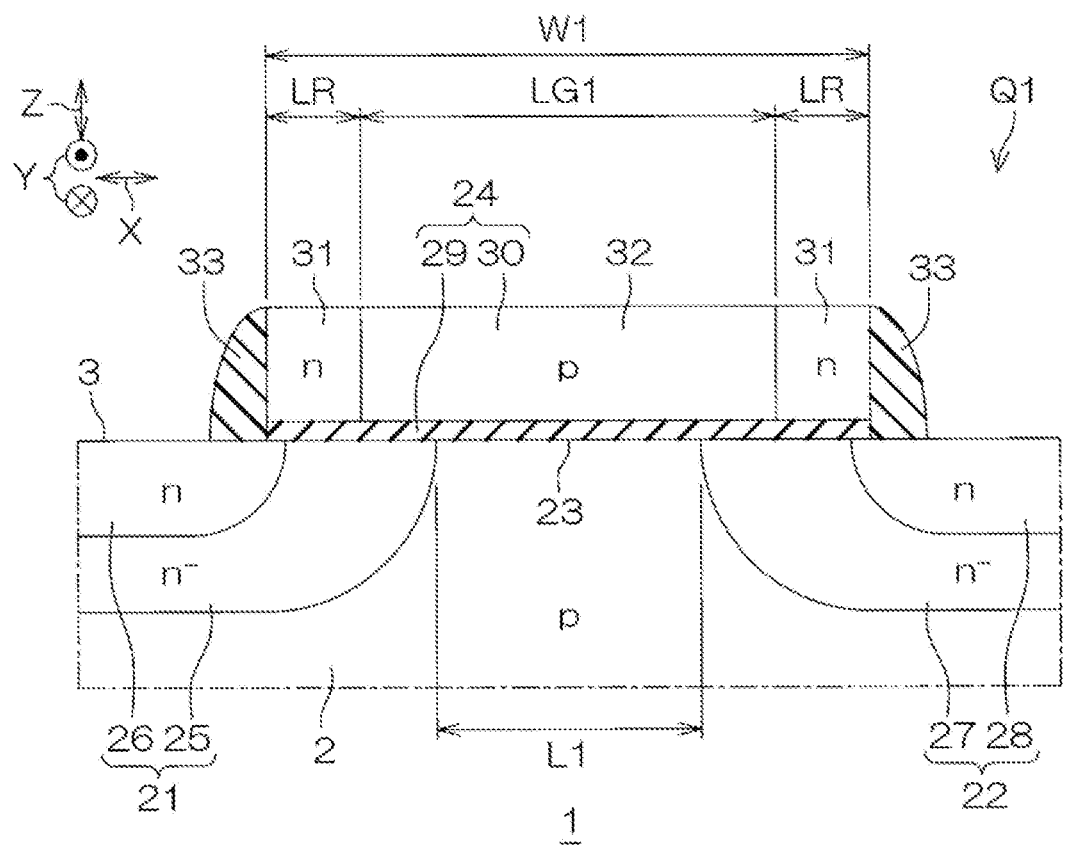
FIG. 5 is an enlarged cross-sectional view of a first transistor shown in FIG. 4.

FIG. 2 is a schematic plan view showing the semiconductor device 1 shown in FIG. 1. FIG. 3 is an enlarged view of a region III (a first device region 6A) shown in FIG. 2. FIG. 4 is a cross-sectional view taken along line IV-IV shown in FIG. 3. FIG. 5 is an enlarged cross-sectional view of the first transistor Q1 shown in FIG. 4. Referring to FIGS. 2 to 4, the semiconductor device 1 includes a rectangular parallelepiped chip 2 (semiconductor chip). In this embodiment, the chip 2 is formed of a p-type (first conductive type) semiconductor substrate. The semiconductor substrate may be a Si substrate or a wide band gap semiconductor substrate (for example, a SiC substrate or a GaN substrate). The chip 2 includes a first main surface 3 on one side, a second main surface 4 on the other side, and first to fourth side surfaces 5A to 5D connecting the first main surface 3 and the second main surface 4.

The first main surface 3 and the second main surface 4 are formed in a rectangular shape in a plan view viewed from their normal direction Z (hereinafter simply referred to as "in a plan view"). The normal direction Z is also the thickness direction of the chip 2. The first side surface 5A and the second side surface 5B extend in a first direction X along the first main surface 3 and face a second direction Y which intersects (specifically, orthogonal to) the first direction X. The third side surface 5C and the fourth side surface 5D extend in the second direction Y and face the first direction X.

The semiconductor device 1 includes a plurality of device regions 6 installed on the first main surface 3. The plurality of device regions 6 are regions in which various functional devices constituting the constant voltage generator 100 are respectively formed. The plurality of device regions 6 are partitioned in the inner portion of the first main surface 3 at intervals from the first to fourth side surfaces 5A to 5D in a plan view. The number, arrangement, and shape of device regions 6 are optional and are not limited to a specific number, arrangement, and shape.

The plurality of functional devices may include at least one of a semiconductor switching device, a semiconductor rectifying device, and a passive device, respectively. The semiconductor switching device may include at least one of JFET (Junction Field Effect Transistor), MISFET (Metal Insulator Semiconductor Field Effect Transistor), BJT (Bipolar Junction Transistor), and IGBT (Insulated Gate Bipolar Junction Transistor).

The semiconductor rectifying device may include at least one of a pn-junction diode, a pin-junction diode, a Zener diode, a Schottky barrier diode, and a fast recovery diode. The passive device may include at least one of a resistor, a capacitor, an inductor, and a fuse. In this embodiment, the plurality of device regions 6 include at least a first device region 6A including the differential stage 106, a second device region 6B including the constant voltage source 107, a third device region 6C including the current mirror stage 108, a fourth device region 6D including the constant current source 109, a fifth device region 6E including the output transistor Q6, and a sixth device region 6F including the resistance voltage divider circuit 110.

The low potential wiring 101 and the high potential wiring 102 may be routed anywhere above the first main surface 3 in an arbitrary manner so as to cross the plurality of device regions 6. The output terminal 105 may be disposed anywhere above the first main surface 3. For example, when an interlayer insulating film is formed on the first main surface 3, the low potential wiring 101 and the high potential wiring 102 are routed into the interlayer insulating film in an arbitrary manner, and the output terminal 105 may be disposed anywhere above the interlayer insulating film.

Hereinafter, a structure on the first device region 6A (the differential stage 106) side will be described in detail with reference to FIGS. 3 to 5. The first device region 6A includes a first transistor region 7 and a second transistor region 8. The first transistor region 7 is installed on one side (the third side surface 5C side in this embodiment) of the first direction X, and the second transistor region 8 is installed on the other side (the fourth side surface 5D side in this embodiment) of the first direction X. The arrangement of the first transistor region 7 and the arrangement of the second transistor region 8 are optional.

The first transistor region 7 may be installed on one side (for example, the first side surface 5A side) of the second direction Y, and the second transistor region 8 may be installed on the other side (for example, the second side surface 5B side) of the second direction Y. In this embodiment, the first transistor region 7 and the second transistor region 8 are set in a rectangular shape in a plan view. The planar shape of the first transistor region 7 and the planar shape of the second transistor region 8 are optional.

The semiconductor device 1 includes a trench structure 9 as an example of a region separation structure for partitioning the first device region 6A in the first main surface 3. In FIG. 3, the trench structure 9 is shown by hatching. The trench structure 9 separates the first transistor region 7 and the second transistor region 8 from other regions, respectively. Specifically, the trench structure 9 includes a first trench separation structure 10 and a second trench separation structure 11.

The first trench separation structure 10 is formed in an annular shape (rectangular annular shape) surrounding the first transistor region 7 in a plan view and partitions the first transistor region 7 from other regions. The second trench separation structure 11 is formed in an annular shape (rectangular annular shape) surrounding the second transistor region 8 in a plan view and partitions the second transistor region 8 from the first transistor region 7. The second trench separation structure 11 is integrated with the first trench separation structure 10 in a region between the first transistor region 7 and the second transistor region 8.

The trench structure 9 includes a trench insulating structure including a trench 12 and a buried body 13. The trench 12 is dug down from the first main surface 3 to the second main surface 4. The trench 12 may be formed in a vertical shape having substantially a constant opening width in a cross-sectional view, or may be formed in a tapered shape in which the opening width narrows toward the bottom wall in a cross-sectional view. The buried body 13 is buried in the trench 12. The buried body 13 includes an insulator buried in the trench 12, as an integrated member. In this case, the buried body 13 may contain at least one of silicon oxide and silicon nitride. Of course, the buried body 13 may contain polysilicon buried in the trench 12 with the insulator interposed therebetween.

The above-mentioned first transistor Q1 is formed in the first transistor region 7. The first transistor Q1 includes an n-type (second conductive type) first drain region 21, an n-type first source region 22, a p-type first channel region 23, and a first planar gate structure 24. The first drain region 21, the first source region 22, and the first planar gate structure 24 form the drain, source, and gate (p-gate) of the first transistor Q1, respectively.

The first drain region 21 is formed on the surface layer portion of the first main surface 3 in the first transistor region 7. The first drain region 21 is formed in a region on one side (the third side surface 5C side) of the first direction X in the first transistor region 7. The first drain region 21 has an n-type impurity concentration gradient in which the impurity concentration gradually decreases from the central portion in the thickness direction and the width direction. In this embodiment, the first drain region 21 includes a first low-concentration drain region 25 and a first high-concentration drain region 26. The first low-concentration drain region 25 is a region having a relatively low n-type impurity concentration and is formed on the surface layer portion of the first main surface 3. The first high-concentration drain region 26 has an n-type impurity concentration higher than that of the first low-concentration drain region 25 and is formed on the surface layer portion of the first low-concentration drain region 25. The first high-concentration drain region 26 is located in the central portion of the first low-concentration drain region 25 in a plan view. The n-type impurities in the first high-concentration drain region 26 are of the same type as the n-type impurities in the first low-concentration drain region 25. The n-type impurity concentration in the first drain region 21 gradually decreases from the first high-concentration drain region 26 toward the first low-concentration drain region 25.

The first source region 22 is formed on the surface layer portion of the first main surface 3 at an interval from the first drain region 21 in the first transistor region 7. The first source region 22 is formed in a region on the other side (the fourth side surface 5D side) of the first direction X in the first transistor region 7. The first source region 22 has a depth substantially equal to that of the first drain region 21. The first source region 22 has an n-type impurity concentration and an n-type impurity concentration gradient that are substantially equal to those of the first drain region 21. That is, the first source region 22 has a concentration gradient in which the n-type impurity concentration gradually decreases from the central portion in the thickness direction and the width direction. The n-type impurities in the first source region 22 are of the same type as the n-type impurities in the first drain region 21.

In this embodiment, the first source region 22 includes a first low-concentration source region 27 and a first high-concentration source region 28. The first low-concentration source region 27 is a region having a relatively low n-type impurity concentration and is formed on the surface layer portion of the first main surface 3. The first high-concentration source region 28 has an n-type impurity concentration higher than that of the first low-concentration source region 27 and is formed on the surface layer portion of the first low-concentration source region 27. The first high-concentration source region 28 is located in the central portion of the first low-concentration source region 27 in a plan view. The n-type impurities in the first high-concentration source region 28 are of the same type as the n-type impurities in the first low-concentration source region 27. The n-type impurity concentration in the first source region 22 gradually decreases from the first high-concentration source region 28 toward the first low-concentration source region 27.

The first channel region 23 is a region between the first drain region 21 and the first source region 22 in the surface layer portion of the first main surface 3. Specifically, the first channel region 23 is a region between the first low-concentration drain region 25 and the first low-concentration source region 27. The first channel region 23 has a first channel length L1. The first channel length L1 is the length of a portion of the first channel region 23 extending in the opposite direction (the first direction X) of the first drain region 21 and the first source region 22. The first channel length L1 may be 0.2 μm or more and 300 μm or less.

The first planar gate structure 24 may be disposed anywhere above the first transistor region 7 at an interval from the second transistor region 8. The first planar gate structure 24 includes a laminated structure including a first gate insulating film 29 and a first gate electrode 30, which are laminated in this order from the first main surface 3 side. The first gate insulating film 29 may contain silicon oxide. The first gate insulating film 29 covers the first channel region 23 above the first main surface 3. In this embodiment, the first gate insulating film 29 is formed in a strip shape extending in a direction (the second direction Y) orthogonal to the opposite direction of the first drain region 21 and the first source region 22 in a plan view.

The first gate insulating film 29 straddles the end portion of the first drain region 21 and the end portion of the first source region 22. Specifically, the first gate insulating film 29 straddles the first low-concentration drain region 25 and the first low-concentration source region 27 and exposes the first high-concentration drain region 26 and the first high-concentration source region 28. The first gate insulating film 29 preferably covers the entire region of the first channel region 23. The first gate insulating film 29 may cover a portion of the first high-concentration drain region 26 and a portion of the first high-concentration source region 28. With respect to the second direction Y, both ends of the first gate insulating film 29 may be connected to the buried body 13 (insulator) of the trench structure 9.

The first gate electrode 30 contains polysilicon. The first gate electrode 30 may be referred to as a "first polysilicon gate." The first gate electrode 30 may be disposed anywhere above the first gate insulating film 29. The first gate electrode 30 faces the first channel region 23 with the first gate insulating film 29 interposed therebetween and controls inversion (on) and non-inversion (off) of the first channel region 23. The first gate electrode 30 is formed in a strip shape extending in a direction (the second direction Y) orthogonal to the opposite direction of the first drain region 21 and the first source region 22 in a plan view.

The first gate electrode 30 faces the end portion of the first drain region 21, the end portion of the first source region 22, and the first channel region 23 with the first gate insulating film 29 interposed therebetween. Specifically, the first gate electrode 30 faces the first low-concentration drain region 25, the first low-concentration source region 27, and the first channel region 23 with the first gate insulating film 29 interposed therebetween and exposes the first high-concentration drain region 26 and the first high-concentration source region 28. It is preferable that the first gate electrode 30 faces the entire region of the first channel region 23 with the first gate insulating film 29 interposed therebetween.

The first gate electrode 30 may face a portion of the first high-concentration drain region 26 and a portion of the first high-concentration source region 28 with the first gate insulating film 29 interposed therebetween. The first gate electrode 30 may include a portion located above the trench structure 9 (see FIG. 3). The first gate electrode 30 has a first electrode width W1 that exceeds the first channel length L1 (L1<W1). The first electrode width W1 is the length of a portion of the first gate electrode 30 extending in the opposite direction (the first direction X) of the first drain region 21 and the first source region 22. The first electrode width W1 may be 0.4 μm or more and 300 μm or less.

The first transistor Q1 includes an n-type first region 31 and a p-type second region 32 formed inside the first gate electrode 30. The first region 31 is formed at the peripheral edge of the first gate electrode 30. The first region 31 is formed in a strip shape extending along the peripheral edge of the first gate electrode 30 in a plan view. The first region 31 is formed at both ends of the first gate electrode 30 in a cross-sectional view in a direction (the first direction X) orthogonal to the direction in which the first gate electrode 30 extends. In this embodiment, the first region 31 is formed in an annular shape surrounding the inner portion of the first gate electrode 30 in a plan view.

The first region 31 faces the first drain region 21 and the first source region 22 with the first gate insulating film 29 interposed therebetween. Specifically, the first region 31 faces the first low-concentration drain region 25 and the first low-concentration source region 27 with the first gate insulating film 29 interposed therebetween. The first region 31 may face a portion of the first high-concentration drain region 26 and a portion of the first high-concentration source region 28 with the first gate insulating film 29 interposed therebetween.

In a cross-sectional view, one first region 31 is formed on the inner side of the first drain region 21 at an interval from the first channel region 23. In a cross-sectional view, the other first region 31 is formed on the inner side of the first source region 22 at an interval from the first channel region 23. In other words, the first drain region 21 and the first source region 22 are formed so as to protrude toward the first channel region 23 with respect to the pair of first regions 31 in a cross-sectional view. It is preferable that the first region 31 faces only the first drain region 21 and the first source region 22 in the first transistor region 7 and does not face the first channel region 23. The first region 31 may include a portion located above the trench structure 9 (see FIG. 3).

The n-type impurities in the first region 31 are of the same type as the n-type impurities in the first drain region 21 and the n-type impurities in the first source region 22. The first region 31 preferably has an n-type impurity concentration equal to or lower than the n-type impurity concentration of the first high-concentration drain region 26 (the first high-concentration source region 28). The n-type impurity concentration in the first region 31 may be substantially equal to the n-type impurity concentration in the first high-concentration drain region 26 (the first high-concentration source region 28). The n-type impurity concentration in the first region 31 preferably exceeds the n-type impurity concentration in the first low-concentration drain region 25 (the first low-concentration source region 27).

The first region 31 has a region length LR that is less than the first channel length L1 (LR<L1). The region length LR is the length of a portion of the first region 31 extending in the opposite direction (the first direction X) of the first drain region 21 and the first source region 22. In a cross-sectional view, the total extension 2×LR, which is the sum of the region lengths LR of the two first regions 31, is preferably less than the first channel length L1 (2×LR<L1). The region length LR is adjusted according to the first electrode width W1, and may exceed 0 μm and be 1 μm or less. The region length LR is preferably 0.1 μm or more and 0.3 μm or less. The region length LR is particularly preferably 0.05 μm or more and 0.15 μm or less.

The second region 32 has a work function different from that of the first region 31 and increases the first gate threshold voltage Vth1 of the first gate electrode 30. The second region 32 is formed in the inner portion of the first gate electrode 30. The second region 32 is formed in the first gate electrode 30 at a ratio (second ratio) larger than the ratio (first ratio) that the first region 31 occupies in the first gate electrode 30. In this embodiment, the second region 32 is formed in a region surrounded by the first region 31 in a plan view and is formed in a strip shape extending in the second direction Y. That is, the second region 32 is formed in the central portion of the first gate electrode 30 in a cross-sectional view in a direction (the first direction X) orthogonal to the extension direction of the first gate electrode 30 and is sandwiched between the two first regions 31. The second region 32 is connected to the first region 31 with respect to the width direction of the first gate electrode 30.

The second region 32 faces the end portion of the first drain region 21, the end portion of the first source region 22, and the first channel region 23 with the first gate insulating film 29 interposed therebetween. Specifically, the second region 32 faces the first low-concentration drain region 25, the first low-concentration source region 27, and the first channel region 23 with the first gate insulating film 29 interposed therebetween. The second region 32 preferably faces the entire region of the first channel region 23. The second region 32 is preferably formed at an interval from the first high-concentration drain region 26 and the first high-concentration source region 28. The second region 32 may include a portion located above the trench structure 9 (see FIG. 3).

The second region 32 has a first gate length LG1 that exceeds the total extension 2×LR of the first region 31 (2×LR<LG1). The first gate length LG1 is the length of a portion of the second region 32 extending in the opposite direction (the first direction X) of the first drain region 21 and the first source region 22. The first gate length LG1 is equal to or larger than the first channel length L1 (L1≤LG1). The first gate length LG1 preferably exceeds the first channel length L1 (L1<LG1). The first gate length LG1 may be 0.2 μm or more and 300 μm or less.

In the first transistor Q1, the first region 31 has a first threshold voltage Vths1, and the second region 32 has a second threshold voltage Vths2 exceeding the first threshold voltage Vths1 (Vths1<Vths2). The first gate threshold voltage Vth1 of the first transistor Q1 is determined by the second threshold voltage Vths2. That is, when a first gate voltage VG1 equal to or higher than the second threshold voltage Vths2 (Vths2≤VG1) is applied to the first gate electrode 30, the first channel region 23 is in an inverted state (on state), and a current flows between the first drain region 21 and the first source region 22.

On the other hand, when the first gate voltage VG1 lower than the second threshold voltage Vths2 (Vths1≤VG1<Vths2) is applied to the first gate electrode 30, the first channel region 23 is in a non-inverted state (off state), and the current is cut off. The first region 31 does not face the first channel region 23 with the first gate insulating film 29 interposed therebetween. Therefore, even if the first gate voltage VG1 equal to or higher than the first threshold voltage Vths1 and less than the second threshold voltage Vths2 (Vths1≤VG1<Vths2) is applied to the first gate electrode 30, the formation of an inversion region in a region directly below the first region 31 is suppressed, and the non-inverted state (off state) of the first channel region 23 is maintained.

In this way, the first transistor Q1 has a first effective channel length determined by the first channel length L1 of the first channel region 23, instead of the first gate length LG1 of the second region 32. The first effective channel length is the length of a region in the first channel region 23, which is inverted due to the first gate voltage VG1. The first effective channel length may be referred to as a "first effective gate length."

In the first transistor Q1, a decrease in accuracy of the first gate threshold voltage Vth1 caused by the first region 31 is suppressed by the second region 32 protruding in the width direction so as to face the first drain region 21 and the first source region 22. In other words, in the first transistor Q1, the decrease in accuracy of the first gate threshold voltage Vth1 is suppressed by the first drain region 21 and the first source region 22 each having a portion protruding toward the first gate electrode 30 so as to narrow the first channel region 23.

The semiconductor device 1 includes a first sidewall structure 33 that covers a sidewall of the first gate electrode 30. The first sidewall structure 33 includes an inorganic insulator. The first sidewall structure 33 may contain at least one of silicon oxide and silicon nitride. The first sidewall structure 33 may be formed in an annular shape surrounding the sidewall of the first gate electrode 30 in a plan view. The first sidewall structure 33 is formed above the first high-concentration drain region 26 and the first high-concentration source region 28 so as to expose a portion of the first high-concentration drain region 26 and a portion of the first high-concentration source region 28. The first sidewall structure 33 may include a portion located above the trench structure 9.

The above-mentioned second transistor Q2 is formed in the second transistor region 8. The second transistor Q2 includes an n-type second drain region 41, an n-type second source region 42, a p-type second channel region 43, and a second planar gate structure 44. The second drain region 41, the second source region 42, and the second planar gate structure 44 form the drain, source, and gate (n-gate) of the second transistor Q2, respectively.

The second drain region 41 is formed on the surface layer portion of the first main surface 3 in the second transistor region 8. The second drain region 41 is formed in a region on the other side (the fourth side surface 5D side) of the first direction X in the second transistor region 8. The second drain region 41 has a depth substantially equal to that of the first drain region 21. The second drain region 41 has an n-type impurity concentration and an n-type impurity concentration gradient that are substantially equal to those of the first drain region 21. That is, the second drain region 41 has a concentration gradient in which the n-type impurity concentration gradually decreases from the central portion in the thickness direction and the width direction. The n-type impurities in the second drain region 41 are of the same type as the n-type impurities in the first drain region 21.

In this embodiment, the second drain region 41 includes a second low-concentration drain region 45 and a second high-concentration drain region 46. The second low-concentration drain region 45 is a region having a relatively low n-type impurity concentration and is formed on the surface layer portion of the first main surface 3. The second high-concentration drain region 46 has an n-type impurity concentration higher than that of the second low-concentration drain region 45 and is formed on the surface layer portion of the second low-concentration drain region 45. The second high-concentration drain region 46 is located in the central portion of the second low-concentration drain region 45 in a plan view. The n-type impurities in the second high-concentration drain region 46 are of the same type as the n-type impurities in the second low-concentration drain region 45. The n-type impurity concentration in the second drain region 41 gradually decreases from the second high-concentration drain region 46 toward the second low-concentration drain region 45.

The second source region 42 is formed on the surface layer portion of the first main surface 3 at an interval from the second drain region 41 in the second transistor region 8. The second source region 42 is formed in a region on one side (the third side surface 5C side) of the first direction X in the second transistor region 8. The second source region 42 has a depth substantially equal to that of the second drain region 41. The second source region 42 has an n-type impurity concentration and an n-type impurity concentration gradient that are substantially equal to those of the second drain region 41. That is, the second source region 42 has a concentration gradient in which the n-type impurity concentration gradually decreases from the central portion in the thickness direction and the width direction. The n-type impurities in the second source region 42 are of the same type as the n-type impurities in the second drain region 41.

In this embodiment, the second source region 42 includes a second low-concentration source region 47 and a second high-concentration source region 48. The second low-concentration source region 47 is a region having a relatively low n-type impurity concentration and is formed on the surface layer portion of the first main surface 3. The second high-concentration source region 48 has an n-type impurity concentration higher than that of the second low-concentration source region 47 and is formed on the surface layer portion of the second low-concentration source region 47. The second high-concentration source region 48 is located in the central portion of the second low-concentration source region 47 in a plan view. The n-type impurities in the second high-concentration source region 48 are of the same type as the n-type impurities in the second low-concentration source region 47. The n-type impurity concentration in the second source region 42 gradually decreases from the second high-concentration source region 48 toward the second low-concentration source region 47.

The second channel region 43 is a region between the second drain region 41 and the second source region 42 in the surface layer portion of the first main surface 3. Specifically, the second channel region 43 is a region between the second low-concentration drain region 45 and the second low-concentration source region 47. The second channel region 43 has a second channel length L2. The second channel length L2 is the length of a portion of the second channel region 43 extending in the opposite direction (the first direction X) of the second drain region 41 and the second source region 42.

The second channel length L2 is less than the first electrode width W1 (L2<W1). The second channel length L2 is less than the first gate length LG1 (L2<LG1). The second channel length L2 is preferably substantially equal to the first channel length L1 (L1≈L2). The second channel length L2 may be 0.2 μm or more and 300 μm or less. In this embodiment, the second planar gate structure 44 is disposed above the second transistor region 8 at an interval from the first transistor region 7 (the first planar gate structure 24). The second planar gate structure 44 includes a laminated structure including a second gate insulating film 49 and a second gate electrode 50, which are laminated in this order from the first main surface 3 side. The second gate insulating film 49 may contain silicon oxide. The second gate insulating film 49 covers the second channel region 43 above the first main surface 3. In this embodiment, the second gate insulating film 49 is formed in a strip shape extending in a direction (the second direction Y) orthogonal to the opposite direction of the second drain region 41 and the second source region 42 in a plan view.

The second gate insulating film 49 straddles the end portion of the second drain region 41 and the end portion of the second source region 42. Specifically, the second gate insulating film 49 straddles the second low-concentration drain region 45 and the second low-concentration source region 47 and exposes the second high-concentration drain region 46 and the second high-concentration source region 48. The second gate insulating film 49 preferably covers the entire region of the second channel region 43. The second gate insulating film 49 may cover a portion of the second high-concentration drain region 46 and a portion of the second high-concentration source region 48. With respect to the second direction Y, both ends of the second gate insulating film 49 may be connected to the buried body 13 (insulator) of the trench structure 9.

The second gate electrode 50 contains polysilicon. The second gate electrode 50 may be referred to as a "second polysilicon gate." The second gate electrode 50 may be disposed anywhere above the second gate insulating film 49. The second gate electrode 50 faces the second channel region 43 with the second gate insulating film 49 interposed therebetween and controls inversion (on) and non-inversion (off) of the second channel region 43. The second gate electrode 50 is formed in a strip shape extending in a direction (the second direction Y) orthogonal to the opposite direction of the second drain region 41 and the second source region 42 in a plan view.

The second gate electrode 50 faces the end portion of the second drain region 41, the end portion of the second source region 42, and the second channel region 43 with the second gate insulating film 49 interposed therebetween. Specifically, the second gate electrode 50 faces the second low-concentration drain region 45, the second low-concentration source region 47, and the second channel region 43 with the second gate insulating film 49 interposed therebetween and exposes the second high-concentration drain region 46 and the second high-concentration source region 48. The second gate electrode 50 preferably faces the entire region of the second channel region 43 with the second gate insulating film 49 interposed therebetween.

The second gate electrode 50 may face a portion of the second high-concentration drain region 46 and a portion of the second high-concentration source region 48 with the second gate insulating film 49 interposed therebetween. The second gate electrode 50 may include a portion located above the trench structure 9 (see FIG. 3). The second gate electrode 50 has a second electrode width W2 that exceeds the second channel length L2 (L2<W2). The second electrode width W2 is the length of a portion of the second gate electrode 50 extending in the opposite direction (the first direction X) of the second drain region 41 and the second source region 42.

The second electrode width W2 exceeds the first channel length L1 (L1<W2). The second electrode width W2 exceeds the first gate length LG1 (LG1<W2). The second electrode width W2 is preferably substantially equal to the first electrode width W1 (W1=W2). The second electrode width W2 may be 0.4 µm or more and 300 µm or less. The second transistor Q2 includes an n-type third region 51 formed inside the second gate electrode 50. The third region 51 is uniformly formed over the entire region of the second gate electrode 50. That is, in this embodiment, the second gate electrode 50 is composed of an n-type polysilicon gate that includes a single third region 51. The third region 51 faces the second drain region 41, the second source region 42, and the second channel region 43 with the second gate insulating film 49 interposed therebetween.

Specifically, the third region 51 faces the second low-concentration drain region 45, the second low-concentration source region 47, and the second channel region 43 with the second gate insulating film 49 interposed therebetween. The third region 51 may face a portion of the second high-concentration drain region 46 and a portion of the second high-concentration source region 48 with the second gate insulating film 49 interposed therebetween. It is preferable that the third region 51 faces the entire region of the second channel region 43 with the second gate insulating film 49 interposed therebetween. The third region 51 may include a portion located above the trench structure 9 (see FIG. 3).

The n-type impurities in the third region 51 are of the same type as the n-type impurities in the second drain region 41 and the n-type impurities in the second source region 42. The third region 51 preferably has an n-type impurity concentration equal to or lower than the n-type impurity concentration of the second high-concentration drain region 46 (the second high-concentration source region 48). The n-type impurity concentration in the third region 51 may be substantially equal to the n-type impurity concentration in the second high-concentration drain region 46 (the second high-concentration source region 48). The n-type impurity concentration in the third region 51 preferably exceeds the n-type impurity concentration in the second low-concentration drain region 45 (the second low-concentration source region 47).

The third region 51 has a second gate length LG2 equal to or larger than the second channel length L2 (L2≤LG2). The second gate length LG2 is the length of a portion of the third region 51 extending in the opposite direction (the first direction X) of the second drain region 41 and the second source region 42. The second gate length LG2 preferably exceeds the second channel length L2 (L2<LG2). The second gate length LG2 is preferably equal to or larger than the first channel length L1 (L1≤LG2). The second gate length LG2 is preferably equal to or larger than the first gate length LG1 (LG1≤LG2). In this embodiment, the second gate length LG2 is substantially equal to the second electrode width W2 (LG2≈W2) and exceeds the first channel length L1 and the first gate length LG1 (L1<LG2 and LG1<LG2).

In the second transistor Q2, the third region 51 has a third threshold voltage Vths3. The third threshold voltage Vths3 is lower than the second threshold voltage Vths2 of the second region 32 (Vths3<Vths2). The second gate threshold voltage Vth2 of the second transistor Q2 is determined by the third threshold voltage Vths3. That is, when the second gate voltage VG2 equal to or higher than the third threshold voltage Vths3 (Vths3≤VG2) is applied to the second gate electrode 50, the second channel region 43 is in an inverted state (on state), and a current flows between the second drain region 41 and the second source region 42.

On the other hand, when the second gate voltage VG2 lower than the third threshold voltage Vths3 (VG1<Vths3) is applied to the second gate electrode 50, the second channel region 43 is in a non-inverted state (off state), and the current is cut off. In this way, the second transistor Q2 has a second effective channel length determined by the second channel length L2, instead of the second gate length LG2. The second effective channel length is the length of a region in the second channel region 43, which is inverted due to the second gate voltage VG2. The second effective channel length may be referred to as a "second effective gate length."

The semiconductor device 1 includes a second sidewall structure 53 that covers a sidewall of the second gate electrode 50. The second sidewall structure 53 includes an inorganic insulator. The second sidewall structure 53 may contain at least one of silicon oxide and silicon nitride. The second sidewall structure 53 may be formed in an annular shape surrounding the sidewall of the second gate electrode 50 in a plan view. The second sidewall structure 53 exposes the second high-concentration drain region 46 and the second high-concentration source region 48. The second sidewall structure 53 may include a portion located above the trench structure 9.

Figure 6:
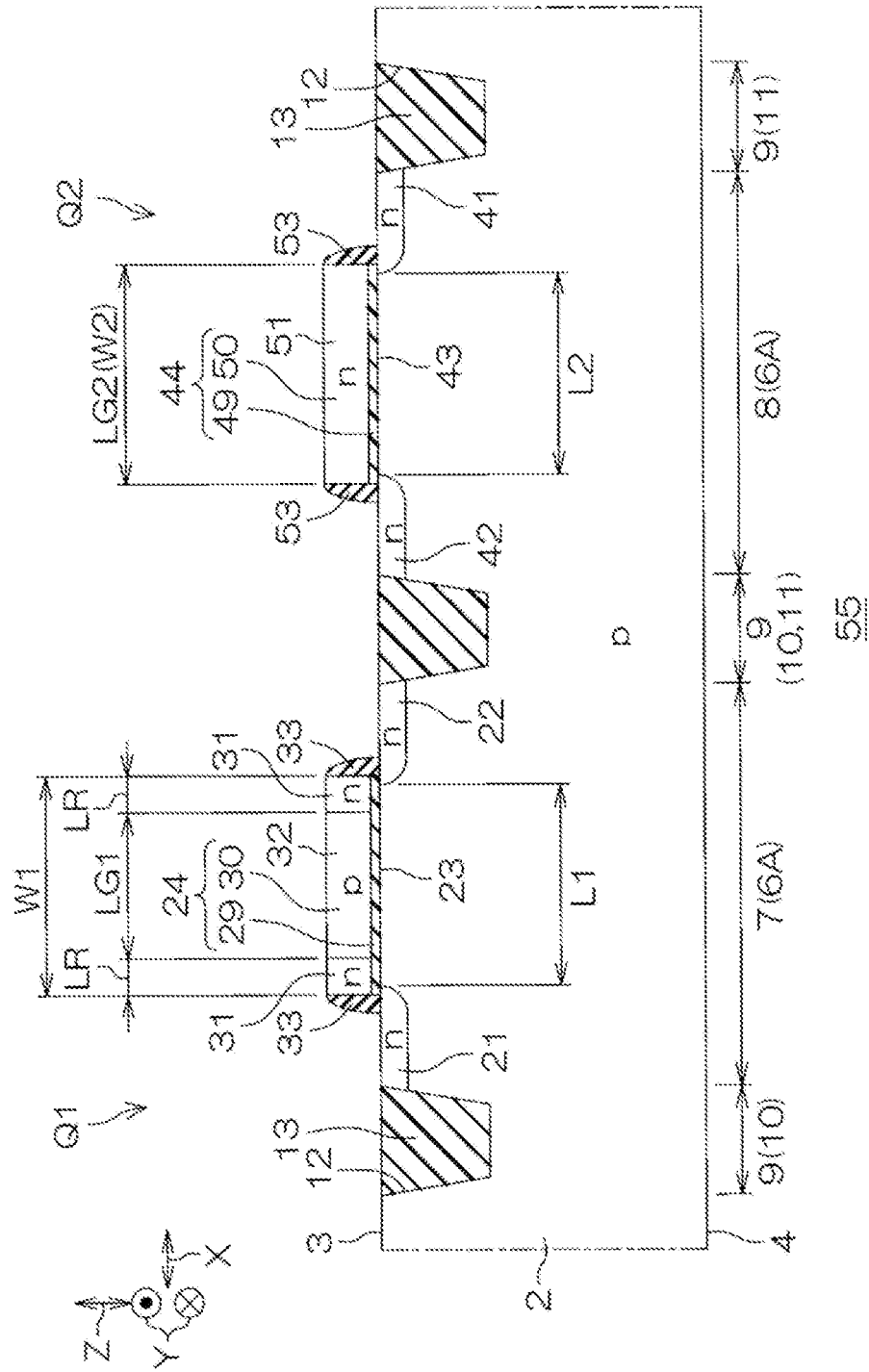
FIG. 6 corresponds to FIG. 4 and is a cross-sectional view showing a semiconductor device according to a reference example.

FIG. 6 corresponds to FIG. 4 and is a cross-sectional view showing a semiconductor device 55 according to a reference example. Hereinafter, structures corresponding to the structures described in the semiconductor device 1 are denoted by the same reference numerals, and explanation thereof will not be repeated. Referring to FIG. 6, the semiconductor device 55 according to the reference example does not have the first low-concentration drain region 25 and the first low-concentration source region 27 in the first transistor region 7, and does not have the second low-concentration drain region 45 and the second low-concentration source region 47 in the second transistor region 8. That is, in the first transistor Q1, the entire region of the second region 32 faces the first channel region 23.

In the first transistor Q1, the second region 32 has the first gate length LG1 smaller than the first channel length L1 (LG1<L1). On the other hand, in the second transistor Q2, the second channel region 43 has the second channel length L2 exceeding the first gate length LG1 (LG1<L2). The second channel length L2 is substantially equal to the first channel length L1 (L1≈L2). In the semiconductor device 55 according to the reference example, when the first gate voltage VG1 equal to or higher than the first threshold voltage Vths1 and lower than the second threshold voltage Vths2 (Vths1≤VG1<Vths2) is applied to the first gate electrode 30, an inversion region is formed in a region in the first channel region 23 directly below in the first region 31. The accuracy of the first gate threshold voltage Vth1 of the first transistor Q1 decreases due to this kind of inversion region. That is, in the semiconductor device 55 according to the reference example, the first effective channel length of the first transistor Q1 is determined by the first region 31 and the second region 32 having different threshold voltages.

Figure 7:
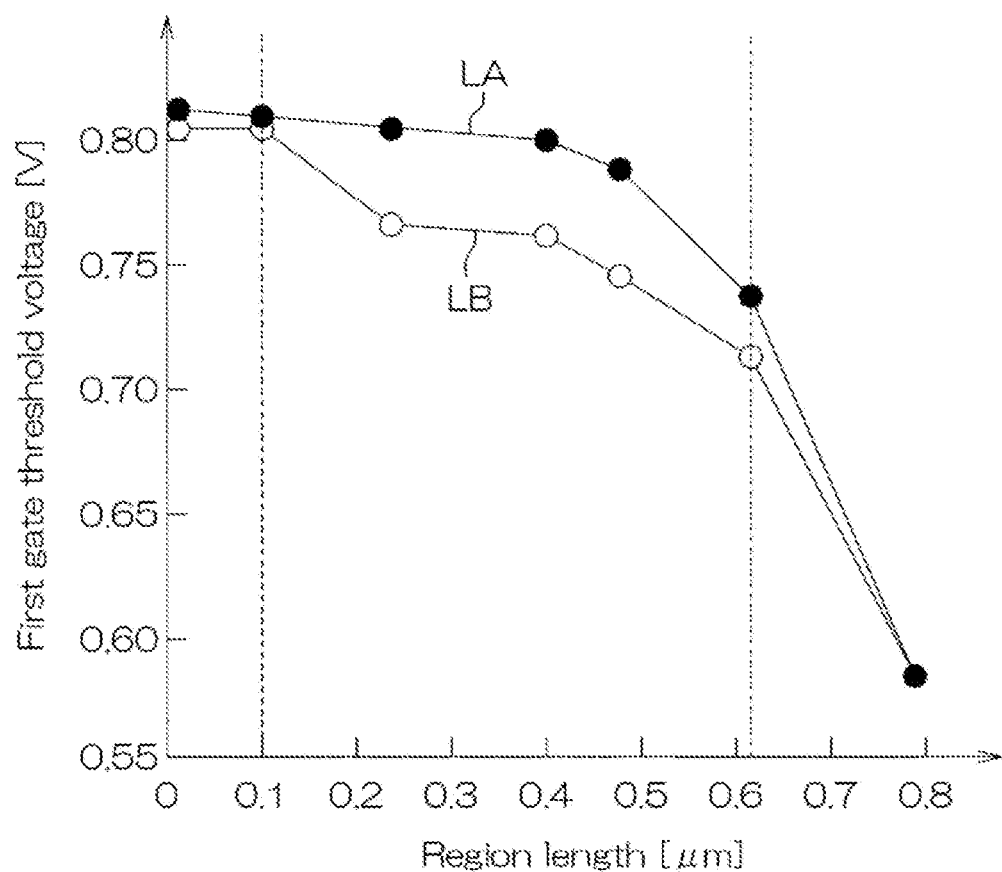
FIG. 7 is a graph showing a first gate threshold voltage.

FIG. 7 is a graph showing the first gate threshold voltage Vth1. In FIG. 7, the vertical axis represents the first gate threshold voltage Vth1 [V], and the horizontal axis represents the region length LR [μm]. FIG. 7 shows a first polygonal line LA and a second polygonal line LB. The first polygonal line LA shows the first gate threshold voltage Vth1 of the semiconductor device 55 according to the reference example. The second polygonal line LB shows the first gate threshold voltage Vth1 of the semiconductor device 1 according to the first embodiment. Here, the region length LR is adjusted to an arbitrary value in a range of more than 0 μm and 0.8 μm or less.

Referring to the first polygonal line LA and the second polygonal line LB, the first gate threshold voltage Vth1 decreases as the region length LR increases. Referring to the first polygonal line LA, when the region length LR is s changed from 0.1 μm to 0.62 μm, the amount of decrease in the first gate threshold voltage Vth1 is about 0.1 V. On the other hand, referring to the second polygonal line LB, when the region length LR is changed from 0.1 μm to 0.62 μm, the amount of decrease in the first gate threshold voltage Vth1 is about 0.07 V.

From the above results, it turns out that the semiconductor device 55 according to the reference example has a structural feature that the first gate threshold voltage Vth1 easily increases or decreases due to manufacture variations in the first region 31. On the other hand, it turns out that the semiconductor device 1 according to the first embodiment has a structural feature that the first gate threshold voltage Vth1 does not easily increase or decrease in the first region 31, as compared with the semiconductor device 55 according to the reference example.

As described above, the semiconductor device 1 includes the chip 2 including the first main surface 3 and the npn-type first transistor Q1 formed on the chip 2. Specifically, the first transistor Q1 includes the n-type first drain region 21, the n-type first source region 22, the first gate insulating film 29, the first gate electrode 30, the n-type first region 31, and the p-type second region 32. The first drain region 21 is formed on the surface layer portion of the first main surface 3. The first source region 22 is formed on the surface layer portion of the first main surface 3 at an interval from the first drain region 21. The first source region 22 partitions the first channel region 23 having the first channel length L1 in a region between the first source region 22 and the first drain region 21 in the surface layer portion of the first main surface 3.

The first gate insulating film 29 covers the first channel region 23 above the first main surface 3. The first gate electrode 30 contains polysilicon and is disposed above the first gate insulating film 29. The first gate electrode 30 controls the inversion and non-inversion of the first channel region 23. The first region 31 is formed on the peripheral edge of the first gate electrode 30. The second region 32 is formed in the inner portion of the first gate electrode 30. The second region 32 has the first gate length LG1 equal to or larger than the first channel length L1 (L1≤LG1). The first transistor Q1 has the first gate threshold voltage Vth1. According to this structure, it is possible to provide the semiconductor device 1 capable of improving the accuracy of the first gate threshold voltage Vth1.

It is preferable that the first region 31 faces the first drain region 21 and the first source region 22 with the first gate insulating film 29 interposed therebetween. It is preferable that the second region 32 faces the first channel region 23 with the first gate insulating film 29 interposed therebetween. It is preferable that the first region 31 does not face the first channel region 23. It is preferable that the second region 32 faces a portion of the first drain region 21 and a portion of the first source region 22 with the first gate insulating film 29 interposed therebetween. The first region 31 preferably surrounds the inner portion of the first gate electrode 30 in a plan view. The second region 32 is preferably surrounded by the first region 31 in a plan view.

The semiconductor device 1 preferably includes the npn-type second transistor Q2 formed in a region different from that of the first transistor Q1 in the chip 2. The second transistor Q2 includes a structure different from that of the first transistor Q1. Specifically, the second transistor Q2 includes the n-type second drain region 41, the n-type second source region 42, the second gate insulating film 49, the second gate electrode 50, and the n-type third region 51. The second drain region 41 is formed on the surface layer portion of the first main surface 3. The second source region 42 is formed on the surface layer portion of the first main surface 3 at an interval from the second drain region 41. The second source region 42 partitions the second channel region 43 having the second channel length L2 in a region between the second source region 42 and the second drain region 41 in the surface layer portion of the second main surface 4.

The second gate insulating film 49 covers the second channel region 43 above the first main surface 3. The second gate electrode 50 contains polysilicon and is disposed above the second gate insulating film 49. The second gate electrode 50 controls the inversion and non-inversion of the second channel region 43. The third region 51 is formed inside the second gate electrode 50. The second region 32 is formed inside the second gate electrode 50. The third region 51 has the second gate length LG2 equal to or larger than the second channel length L2 (L2≤LG2). The second transistor Q2 has the second gate threshold voltage Vth2. According to this structure, in the structure including the second transistor Q2, it is possible to improve the accuracy of the first gate threshold voltage Vth1 of the first transistor Q1.

The second channel length L2 is preferably equal to or smaller than the first gate length LG1 (L2≤LG1). The second gate length LG2 is preferably equal to or larger than the first channel length L1 (L1≤LG2). The second gate length LG2 is preferably equal to or larger than the first gate length LG1 (LG1≤LG2). The second channel length L2 is preferably substantially equal to the first channel length L1 (L1 L2). The third region 51 is preferably formed over the entire region of the second gate electrode 50.

The second gate threshold voltage Vth2 is preferably different from the first gate threshold voltage Vth1 (Vth1≠Vth2). According to this structure, it is possible to improve the accuracy of the first gate threshold voltage Vth1 different from the second gate threshold voltage Vth2. The second transistor Q2 is preferably electrically connected to the first transistor Q1. The second transistor Q2 preferably forms the differential connection with the first transistor Q1. According to this structure, it is possible to improve the output accuracy of the differential stage 106.

The semiconductor device 1 may include the first transistor region 7 installed on the first main surface 3, the second transistor region 8 installed on the first main surface 3 at an interval from the first transistor region 7, and the region separation structure formed on the first main surface 3 so as to electrically separate the first transistor region 7 from the other regions and electrically separate the second transistor region 8 from the other regions. In this case, the first transistor Q1 may be formed in the first transistor region 7, and the second transistor Q2 may be formed in the second transistor region 8. The second gate electrode 50 may be formed at an interval from the first gate electrode 30.

The semiconductor device 1 may include the constant current source 109 formed in a region different from that of the first transistor Q1 in the chip 2 and electrically connected to the first transistor Q1. According to this structure, in the structure including the constant current source 109, it is possible to improve the accuracy of the first gate threshold voltage Vth1 of the first transistor Q1. The semiconductor device 1 may include the current mirror stage 108 formed in a region different from that of the first transistor Q1 in the chip 2 and electrically connected to the first transistor Q1. According to this structure, in the structure including the current mirror stage 108, it is possible to improve the accuracy of the first gate threshold voltage Vth1 of the first transistor Q1. The semiconductor device 1 may include the constant voltage generator 100 including the differential stage 106, the current mirror stage 108, and the constant current source 109. According to this structure, it is possible to improve the output accuracy of the constant voltage generator 100.

Figure 8:
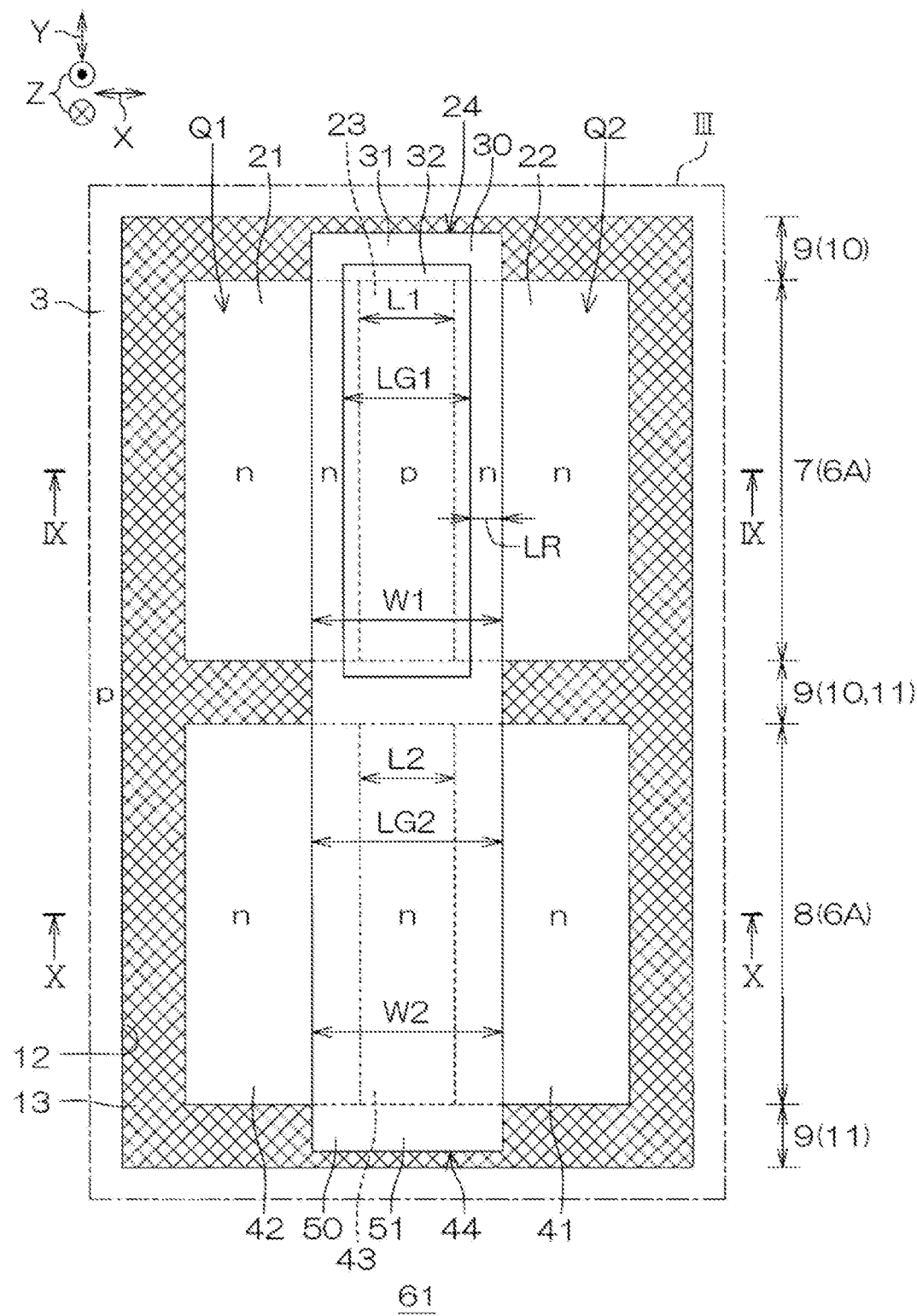
FIG. 8 corresponds to FIG. 3 and is a plan view showing a semiconductor device according to a second embodiment of the present disclosure.
Figure 9:
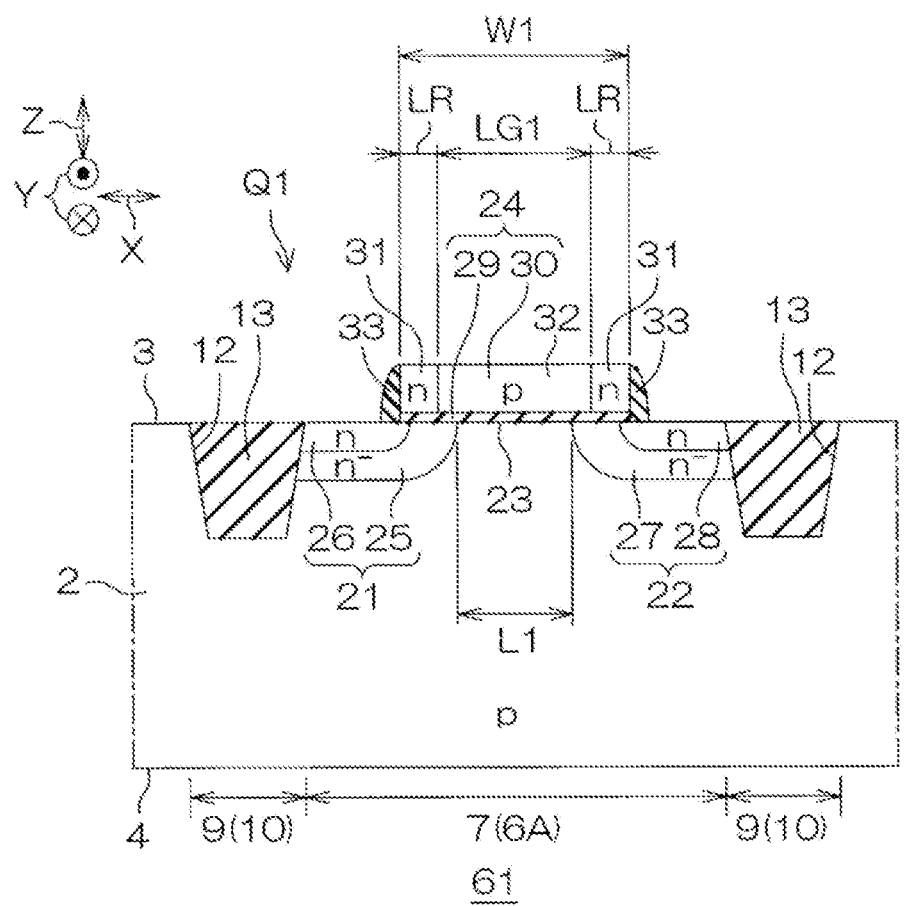
FIG. 9 is a cross-sectional view taken along line IX-IX shown in FIG. 8.
Figure 10:
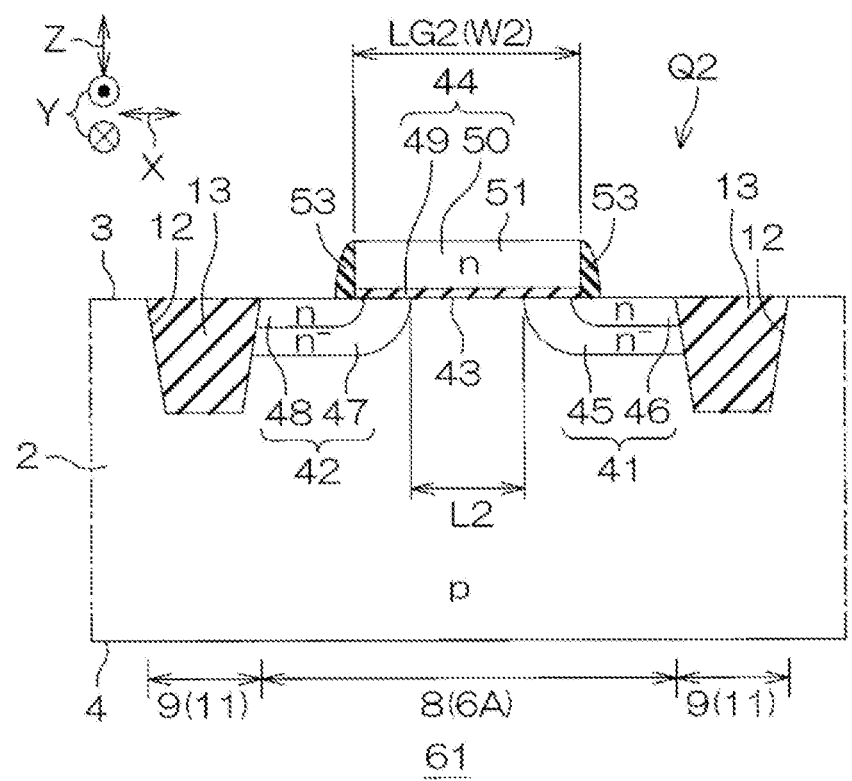
FIG. 10 is a cross-sectional view taken along line X-X shown in FIG. 8.

FIG. 8 corresponds to FIG. 3 and is a plan view showing a semiconductor device 61 according to a second embodiment of the present disclosure. FIG. 9 is a cross-sectional view taken along line IX-IX shown in FIG. 8. FIG. 10 is a cross-sectional view taken along line X-X shown in FIG. 8. Hereinafter, structures corresponding to the structures described in the semiconductor device 1 are denoted by the same reference numerals, and explanation thereof will not be repeated. Referring to FIGS. 8 to 10, as in the case of the semiconductor device 1, the semiconductor device 61 includes a first transistor region 7, a second transistor region 8, a trench structure 9, a first transistor Q1, and a second transistor Q2. In FIG. 8, the trench structure 9 is shown by hatching. In this embodiment, the first transistor region 7 is installed on one side (the first side surface 5A side) of the second direction Y, and the second transistor region 8 is installed on the other side (the second side surface 5B side) of the second direction Y.

The first transistor Q1 includes an n-type first drain region 21, an n-type first source region 22, a p-type first channel region 23, and a first planar gate structure 24 and is formed in the first transistor region 7 in the same manner as in the case of the first embodiment. A second region 32 of a first gate electrode 30 is formed in a portion of the first gate electrode 30 located in the first transistor region 7 and is not formed in the second transistor region 8.

The second transistor Q2 includes an n-type second drain region 41, an n-type second source region 42, a p-type second channel region 43, and a second planar gate structure 44 and is formed in the second transistor region 8 in the same manner as in the case of the first embodiment. In this embodiment, the second planar gate structure 44 is integrated with the first planar gate structure 24. That is, the second planar gate structure 44 includes a second gate electrode 50 forming one gate electrode (polysilicon gate) with the first gate electrode 30.

Specifically, the second gate electrode 50 is integrated with the first gate electrode 30 above the trench structure 9. A third region 51 of the second gate electrode 50 is formed over the entire portion of the second gate electrode 50 located in the second transistor region 8 and is connected to the first region 31 of the first gate electrode 30 above the trench structure 9. The third region 51 surrounds the second region 32 of the first transistor Q1 together with the first region 31 of the first transistor Q1 in a plan view.

Figure 11:
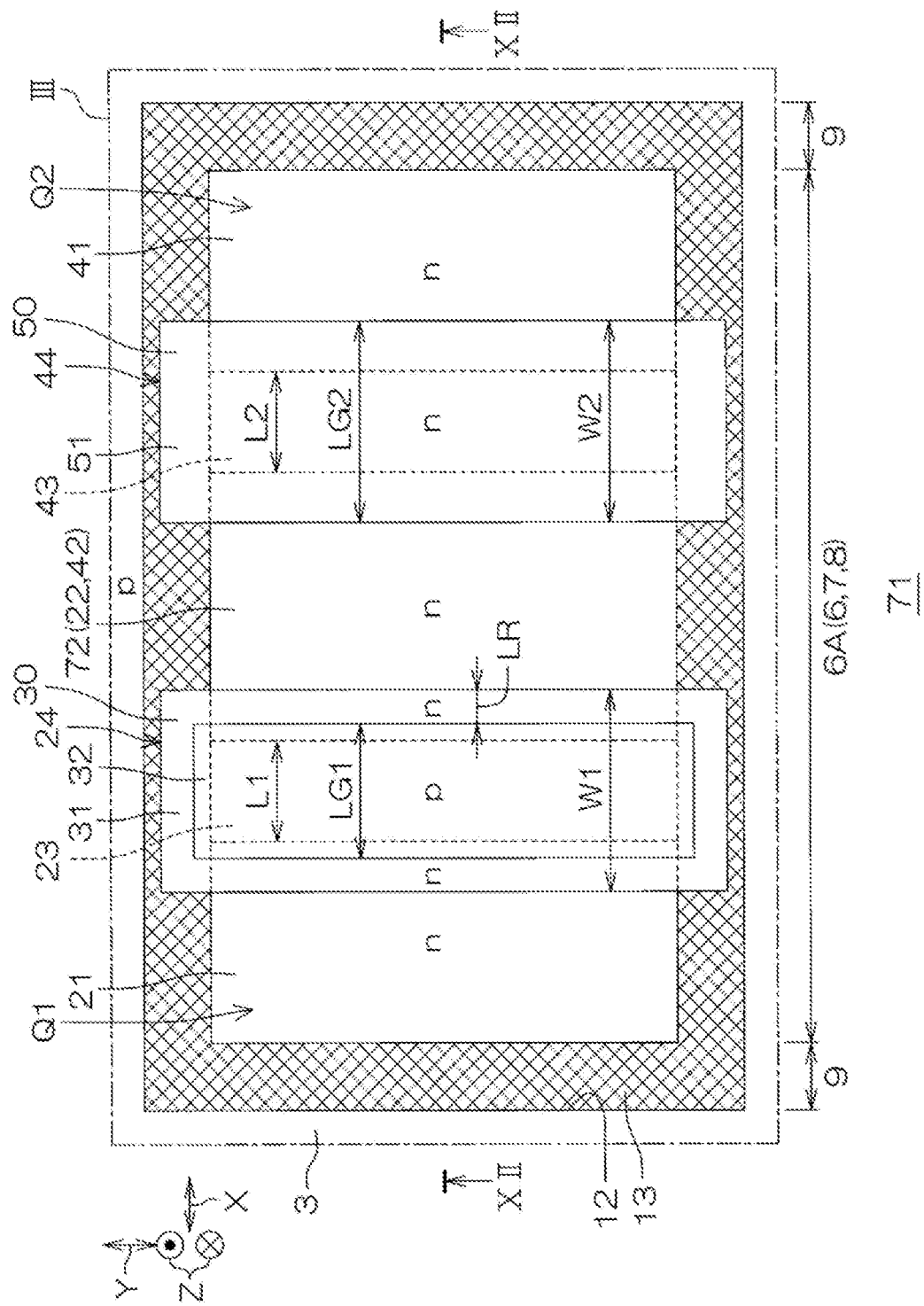
FIG. 11 corresponds to FIG. 3 and is a plan view showing a semiconductor device according to a third embodiment of the present disclosure.
Figure 12:
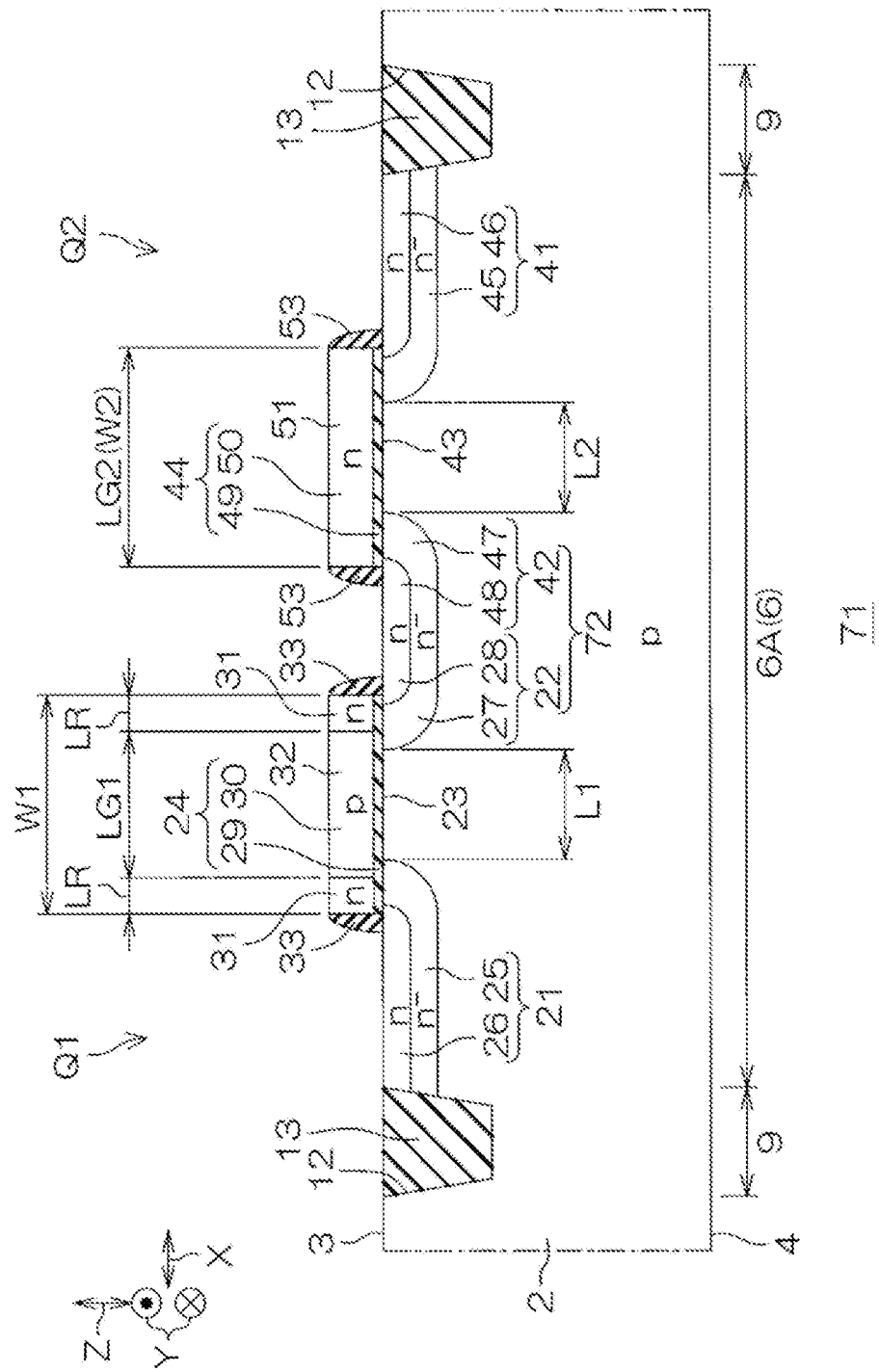
FIG. 12 is a cross-sectional view taken along line XII-XII shown in FIG. 11.

As described above, the semiconductor device 61 also achieves the same effects as those described for the semiconductor device 1. FIG. 11 corresponds to FIG. 3 and is a plan view showing a semiconductor device 71 according to a third embodiment of the present disclosure. FIG. 12 is a cross-sectional view taken along line XII-XII shown in FIG. 11. Hereinafter, structures corresponding to the structures described in the semiconductor device 1 are denoted by the same reference numerals, and explanation thereof will not be repeated.

Referring to FIGS. 11 and 12, as in the case of the semiconductor device 1, the semiconductor device 71 includes a first transistor region 7, a second transistor region 8, a trench structure 9, a first transistor Q1, and a second transistor Q2. In FIG. 11, the trench structure 9 is shown by hatching. In this embodiment, the first transistor region 7 is installed on one side (the third side surface 5C side) of the first direction X, and the second transistor region 8 is installed on the other side (the fourth side surface 5D side) of the first direction X so as to be integrated with the first transistor region 7.

That is, in this embodiment, the second transistor region 8 forms one device region 6 that is integrated with the first transistor region 7. In this embodiment, the trench structure 9 is formed in an annular shape (rectangular annular shape) that collectively surrounds the first transistor region 7 and the second transistor region 8 as one first device region 6A in a plan view. The trench structure 9 does not electrically separate the second transistor region 8 from the first transistor region 7.

The first transistor Q1 includes an n-type first drain region 21, an n-type first source region 22, a p-type first channel region 23, and a first planar gate structure 24 and is formed in the first transistor region 7 in the same manner as in the case of the first embodiment. The second transistor Q2 includes an n-type second drain region 41, an n-type second source region 42, a p-type second channel region 43, and a second planar gate structure 44 and is formed in the second transistor region 8 in the same manner as in the case of the second embodiment.

In this embodiment, the second source region 42 of the second transistor Q2 is integrated with the first source region 22 of the first transistor Q1. That is, the second source region 42 forms one source/source region 72 together with the first source region 22. The source/source region 72 includes a first low-concentration source region 27 (a second low-concentration source region 47) and a first high-concentration source region 28 (a second high-concentration source region 48).

In the case of the semiconductor device 1 according to the first embodiment, the drain of the bias transistor Q5 is electrically connected to the first source region 22 of the first transistor Q1 and the second source region 42 of the second transistor Q2 (see FIG. 1). On the other hand, in the case of the semiconductor device 71, the drain of the bias transistor Q5 is electrically connected to the source/source region 72. As described above, the semiconductor device 71 also achieves the same effects as those described for the semiconductor device 1.

Figure 13:
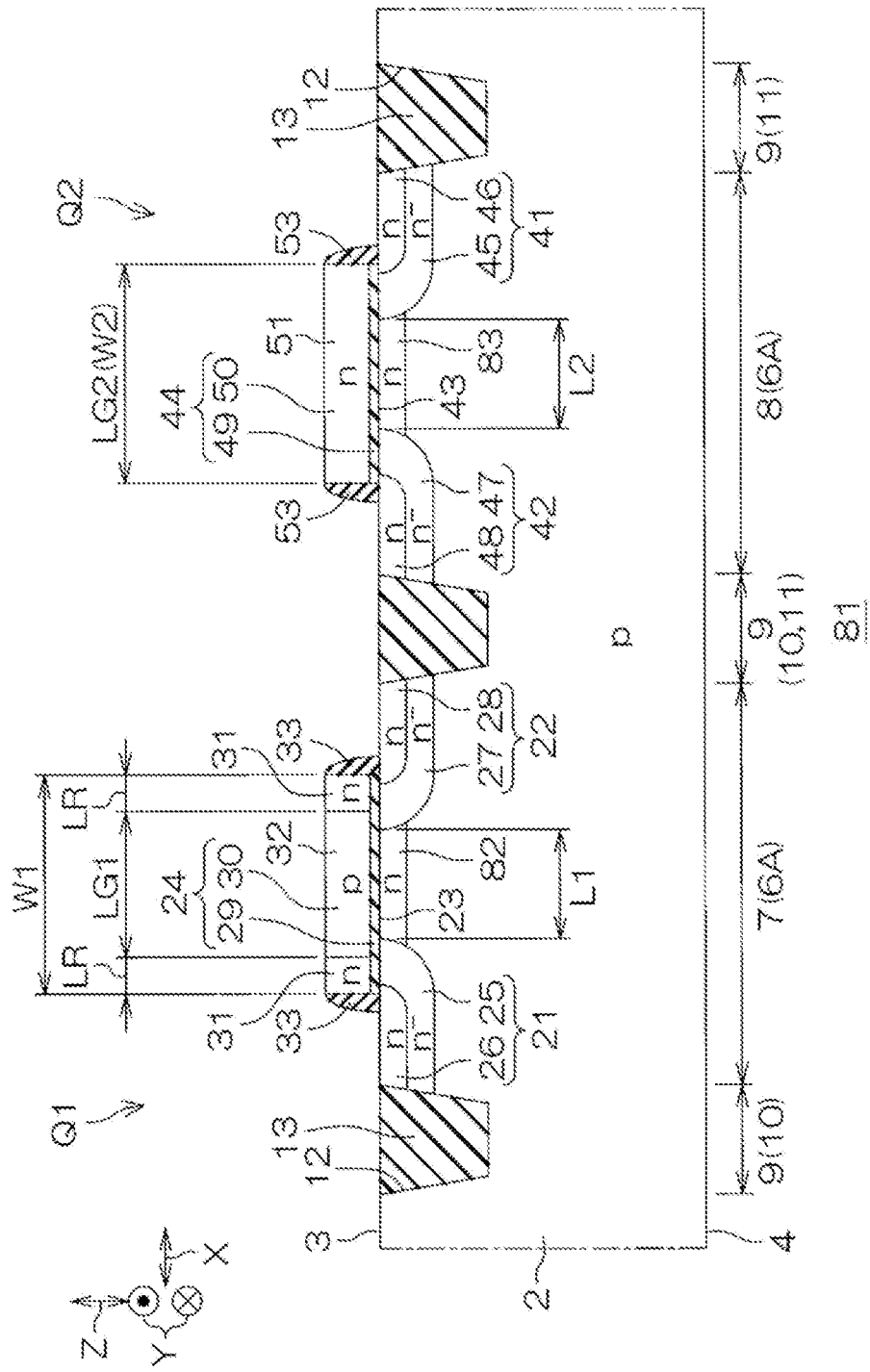
FIG. 13 corresponds to FIG. 4 and is a cross-sectional view showing a semiconductor device according to a fourth embodiment of the present disclosure.

FIG. 13 corresponds to FIG. 4 and is a cross-sectional view showing a semiconductor device 81 according to a fourth embodiment of the present disclosure. Hereinafter, structures corresponding to the structures described in the semiconductor device 1 are denoted by the same reference numerals, and explanation thereof will not be repeated. Referring to FIG. 13, the semiconductor device 81 includes a depletion type first transistor Q1 and a depletion type second transistor Q2. Specifically, the first transistor Q1 includes an n-type first impurity region 82 formed in a region between a first drain region 21 and a first source region 22 in the surface layer portion of the first main surface 3. The first impurity region 82 may be formed over the entire region between the first drain region 21 and the first source region 22 in the surface layer portion of the first main surface 3. The first impurity region 82 is preferably formed shallower than the first drain region 21 and the first source region 22. It is particularly preferable that the first impurity region 82 is formed shallower than a first high-concentration drain region 26 and a first high-concentration source region 28.

Specifically, the second transistor Q2 includes an n-type second impurity region 83 formed in a region between a second drain region 41 and a second source region 42 in the surface layer portion of the first main surface 3. The second impurity region 83 may be formed over the entire region between the second drain region 41 and the second source region 42 in the surface layer portion of the first main surface 3. The second impurity region 83 is preferably formed shallower than the second drain region 41 and the second source region 42. It is particularly preferable that the second impurity region 83 is formed shallower than a second high-concentration drain region 46 and a second high-concentration source region 48.

Figure 14:
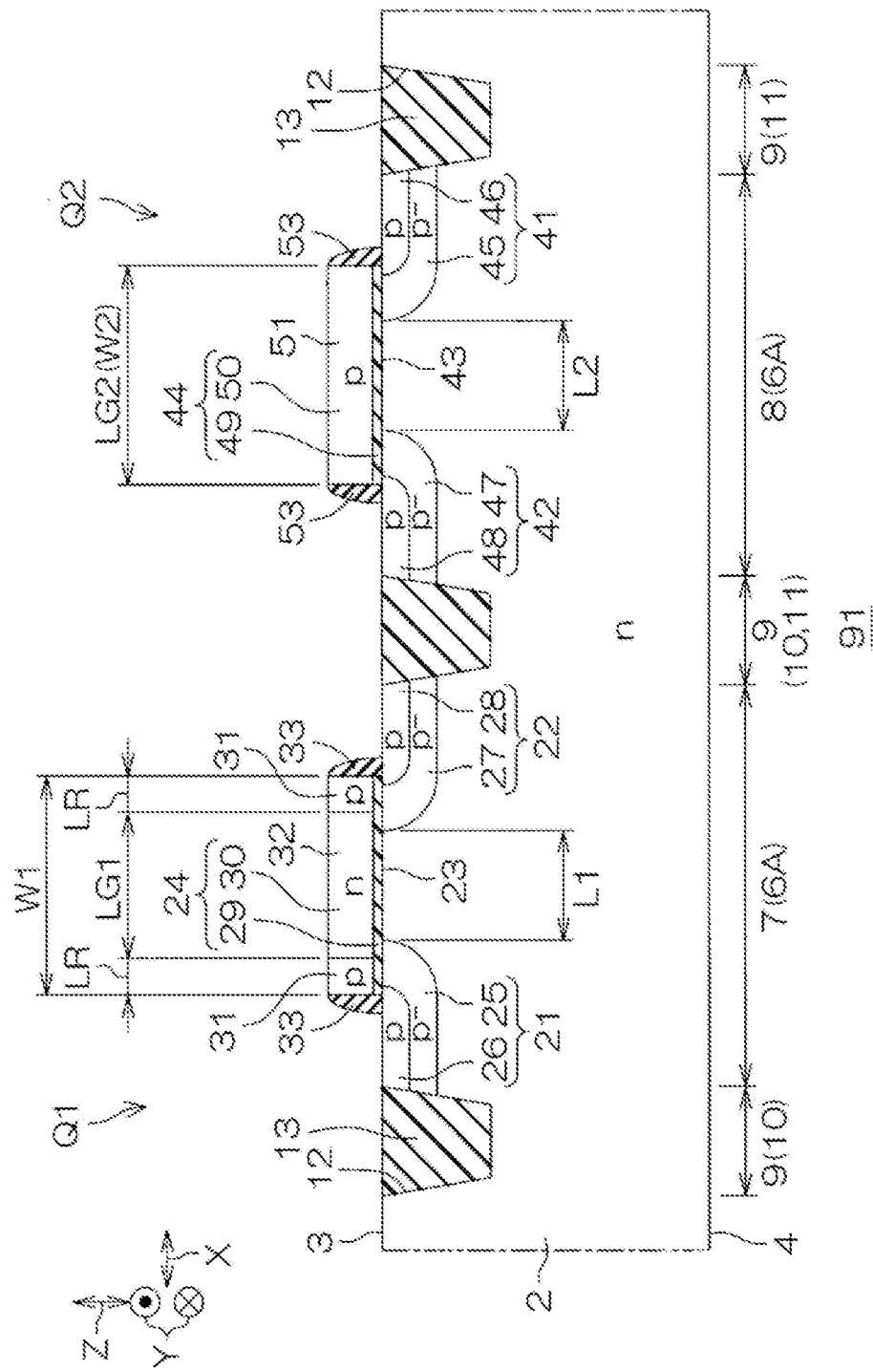
FIG. 14 corresponds to FIG. 4 and is a cross-sectional view showing a semiconductor device according to a fifth embodiment of the present disclosure.

As described above, the semiconductor device 81 also achieves the same effects as those described for the semiconductor device 1. FIG. 14 corresponds to FIG. 4 and is a cross-sectional view showing a semiconductor device 91 according to a fifth embodiment of the present disclosure. Hereinafter, structures corresponding to the structures described in the semiconductor device 1 are denoted by the same reference numerals, and explanation thereof will not be repeated. In the above-described semiconductor device 1, the example in which the first conductive type is the p-type and the second conductive type is the n-type has been described. On the other hand, referring to FIG. 14, the semiconductor device 91 includes a structure in which the "p-type region" is inverted to the "n-type region" and the "n-type region" is inverted to the "p-type region" in the semiconductor device 1 according to the first embodiment. A specific description of this case can be obtained by replacing the "p-type region" with the "n-type region" and replacing the "n-type region" with the "p-type region" in the description of the above-described semiconductor device 1.

Figure 15:
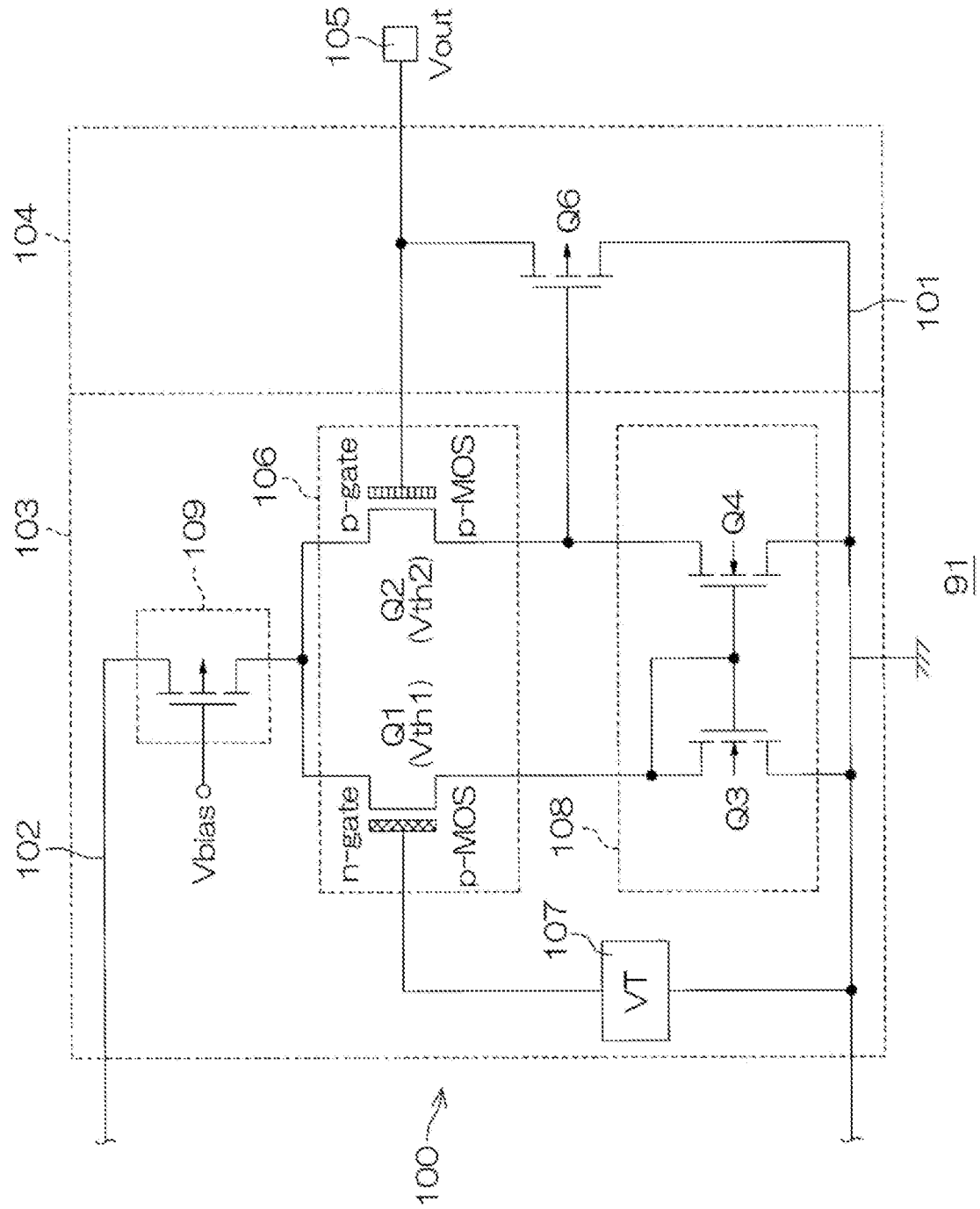
FIG. 15 is a circuit diagram showing an electric circuit included in the semiconductor device shown in FIG. 14.

FIG. 15 is a circuit diagram showing an electric circuit included in the semiconductor device 91 shown in FIG. 14. Referring to FIG. 15, the semiconductor device 91 includes a constant voltage generator 100. The constant voltage generator 100 includes a low potential wiring 101, a high potential wiring 102, a differential circuit 103, an output circuit 104, and an output terminal 105. A low potential (for example, ground potential) is applied to the low potential wiring 101, and a high potential (for example, power supply potential) based on the low potential is applied to the high potential wiring 102.

The differential circuit 103 includes a differential stage 106, a constant voltage source 107, a current mirror stage 108, and a constant current source 109. The differential stage 106 is interposed between the low potential wiring 101 and the high potential wiring 102. The differential stage 106 includes a first transistor Q1 and a second transistor Q2 that forms differential connection with the first transistor Q1. In this embodiment, the first transistor Q1 and the second transistor Q2 are each composed of a pnp-type (second polar type) MISFET of an enhancement type.

The first transistor Q1 and the second transistor Q2 each include a drain, a source, and a gate. The gate of the first transistor Q1 is composed of an n-gate containing n-type impurities as main impurities. The gate of the second transistor Q2 is composed of a p-gate containing p-type impurity as main impurities. The first transistor Q1 has a first gate threshold voltage Vth1, and the second transistor Q2 has a second gate threshold voltage Vth2 (Vth1≠Vth2) different from the first gate threshold voltage Vth1.

The first gate threshold voltage Vth1 is determined by the work function of the n-gate, and the second transistor Q2 is determined by the work function of the p-gate. In this embodiment, the second gate threshold voltage Vth2 exceeds the first gate threshold voltage Vth1 (Vth1<Vth2). A gate threshold voltage difference ΔVth (=Vth2−Vth1) between the first gate threshold voltage Vth1 and the second gate threshold voltage Vth2 has a negative temperature characteristic depending on a band gap voltage in a sub-threshold region.

The constant voltage source 107 is electrically connected to the n-gate of the first transistor Q1 and applies a constant voltage VT to the n-gate of the first transistor Q1. It is preferable that the constant voltage source 107 includes a PTAT voltage source, has a positive temperature characteristic, and generates the constant voltage VT proportional to the absolute temperature. In this case, the constant voltage source 107 is configured (adjusted) so that the gate threshold voltage difference ΔVth having a negative temperature characteristic is complemented by the constant voltage VT having the positive temperature characteristic. The constant voltage source 107 may be configured by the variable resistor as described above.

The current mirror stage 108 is interposed between the low potential wiring 101 and the differential stage 106. In this embodiment, the current mirror stage 108 includes a first load transistor Q3 and a second load transistor Q4 that forms current mirror connection with the first load transistor Q3. The current mirror stage 108 forms a current mirror type differential transistor circuit, together with the differential stage 106. The first load transistor Q3 and the second load transistor Q4 are each composed of an npn-type (first polar type) MISFET of an enhancement type. The first load transistor Q3 and the second load transistor Q4 each include a drain, a source, and a gate.

The drain of the first load transistor Q3 is electrically connected to the drain of the first transistor Q1. The source of the first load transistor Q3 is electrically connected to the low potential wiring 101. The gate of the first load transistor Q3 is short-circuited to the drain of the first load transistor Q3 to form diode connection with the drain. The drain of the second load transistor Q4 is electrically connected to the drain of the second transistor Q2. The source of the second load transistor Q4 is electrically connected to the low potential wiring 101. The gate of the second load transistor Q4 is electrically connected to the gate of the first load transistor Q3.

The constant current source 109 is interposed between the high potential wiring 102 and the differential stage 106. The constant current source 109 includes a bias transistor Q5. The bias transistor Q5 is composed of a pnp-type MISFET of an enhancement type. The bias transistor Q5 includes a drain, a source, and a gate. The source of the bias transistor Q5 is electrically connected to the high potential wiring 102. The drain of the bias transistor Q5 is electrically connected to the source of the first transistor Q1 and the source of the second transistor Q2. A bias voltage Vbias is applied to the gate of the bias transistor Q5.

The output circuit 104 includes an output transistor Q6. In this embodiment, the output transistor Q6 is composed of a pnp-type MISFET of an enhancement type. The output transistor Q6 includes a drain, a source, and a gate. The drain of the output transistor Q6 is electrically connected to the low potential wiring 101. The source of the output transistor Q6 is electrically connected to the p-gate of the second transistor Q2. The gate of the output transistor Q6 is electrically connected to the drain of the second transistor Q2 and the drain of the second load transistor Q4.

The output terminal 105 is electrically connected to the p-gate of the second transistor Q2 and the source of the output transistor Q6 and outputs an output voltage Vout. The output voltage Vout is a value ($\Delta$Vth+VT) obtained by adding the gate threshold voltage difference $\Delta$Vth and the constant voltage VT. In this way, the constant voltage generator 100 generates the output voltage Vout corresponding to a work function difference voltage (the gate threshold voltage difference $\Delta$Vth). That is, the output accuracy of the constant voltage generator 100 is improved by improving the accuracy of the first gate threshold voltage Vth1 and the accuracy of the second gate threshold voltage Vth2.

As described above, the semiconductor device 91 also achieves the same effects as those described for the semiconductor device 1. The semiconductor device 91 may include a structure in which the "p-type region" and the "n-type region" are inverted in the semiconductor devices 61, 71, and 81 according to the second to fourth embodiments. In this case, a specific structure can be obtained by replacing the "p-type region" with the "n-type region" and replacing the "n-type region" with "p-type region" in the description and drawings of the above-described second to fourth embodiments.

The present disclosure can be implemented in other embodiments. For example, in each of the above-described embodiments, the example in which the constant voltage generator 100 including the differential stage 106, the constant voltage source 107, the current mirror stage 108, the constant current source 109, the output transistor Q6, and the resistance voltage divider circuit 110 is formed has been described. However, in each of the above-described embodiments, a circuit that does not have at least one of the constant voltage source 107, the current mirror stage 108, the constant current source 109, the output transistor Q6, and the resistance voltage divider circuit 110 may be adopted.

Further, the first transistor Q1 and the second transistor Q2 do not necessarily have to form the differential stage 106. That is, the second transistor Q2 may be electrically separated from the first transistor Q1. Of course, in each of the above-described embodiments, a structure that does not have the second transistor Q2 may be adopted. In each of the above-described embodiments, the example in which the trench structure 9 including the trench 12 and the buried body 13 is formed has been described. However, in each of the above-described embodiments, instead of the trench structure 9, a field insulating film as an example of the region separation structure for partitioning the first device region 6A may be formed. The field insulating film may contain at least one of silicon oxide and silicon nitride. The field insulating film is preferably formed of a silicon oxide film made of oxide of the chip 2. In this case, the field insulating film may be referred to as a "LOCOS film."

In the above-described second embodiment, the example in which the second planar gate structure 44 (the second gate electrode 50) is integrated with the first planar gate structure 24 (the first gate electrode 30) has been described. However, the structure in which the second planar gate structure 44 (the second gate electrode 50) is integrated with the first planar gate structure 24 (the first gate electrode 30) may also be applied to the first embodiment, the third embodiment, the fourth embodiment, and the fifth embodiment.

The structures according to the first to fifth embodiments may be combined in any manner among them. For example, by combining the technical idea according to the fifth embodiment with the technical ideas according to the first to fourth embodiments, a CMIS (Complementary-MIS) structure including the npn-type first transistor Q1 and the pnp-type second transistor Q2 or a CMIS structure including the pnp-type first transistor Q1 and the npn-type second transistor Q2 may be formed.

The following are examples of features extracted from the specification and the drawings. [A1] to [A20] shown below provide semiconductor devices capable of improving the accuracy of a gate threshold voltage.

[A1] A semiconductor device including: a chip including a main surface; and a first transistor formed in the chip, wherein the first transistor includes: a first drain region of a first conductive type that is formed on a surface layer portion of the main surface; a first source region of the first conductive type that is formed on the surface layer portion of the main surface at an interval from the first drain region and partitions a first channel region having a first channel length L1 in a region between the first source region and the first drain region; a first gate insulating film that covers the first channel region; a first gate electrode that contains polysilicon and is formed on the first gate insulating film; a first region of the first conductive type that is formed in a peripheral portion of the first gate electrode; and a second region of a second conductive type that is formed in an inner portion of the first gate electrode and has a first gate length LG1 equal to or larger than the first channel length L1 (L1≤LG1).

[A2] The semiconductor device of A1, wherein the first region faces the first drain region and the first source region with the first gate insulating film interposed therebetween, and wherein the second region faces the first channel region with the first gate insulating film interposed therebetween.

[A3] The semiconductor device of A1 or A2, wherein the first region does not face the first channel region.

[A4] The semiconductor device of any one of A1 to A3, wherein the first region surrounds the inner portion of the first gate electrode in a plan view, and wherein the second region is surrounded by the first region in a plan view.

[A5] The semiconductor device of any one of A1 to A4, further including: a second transistor that is formed in a region different from a region of the first transistor in the chip, wherein the second transistor includes: a second drain region of the first conductive type that is formed on the surface layer portion of the main surface; a second source region of the first conductive type that is formed on the surface layer portion of the main surface at an interval from the second drain region and partitions a second channel region having a second channel length L2 in a region between the second source region and the second drain region; a second gate insulating film that covers the second channel region; a second gate electrode that contains polysilicon and is formed on the second gate insulating film; and a third region of the second conductive type that is formed in an inner portion of the second gate electrode and has a second gate length LG2 equal to or larger than the second channel length L2 (L2≤LG2).

[A6] The semiconductor device of A5, wherein the first transistor has a first gate threshold voltage Vth1, and wherein the second transistor has a second gate threshold voltage Vth2 different from the first gate threshold voltage Vth1(Vth1≠Vth2).

[A7] The semiconductor device of A5 or A6, wherein the second channel length L2 is equal to or smaller than the first gate length LG1 (L2≤LG1).

[A8] The semiconductor device of any one of A5 to A7, wherein the second gate length LG2 is equal to or larger than the first channel length L1 (L1≤LG2).

[A9] The semiconductor device of any one of A5 to A8, wherein the second gate length LG2 is equal to or larger than the first gate length LG1 (LG1≤LG2).

[A10] The semiconductor device of any one of A5 to A9, wherein the second channel length L2 is substantially equal to the first channel length L1 (L1≈L2).

[A11] The semiconductor device of any one of A5 to A10, wherein the third region is formed over an entire region of the second gate electrode.

[A12] The semiconductor device of any one of A5 to A11, wherein the second transistor is electrically connected to the first transistor.

[A13] The semiconductor device of any one of A5 to A12, wherein the second transistor forms differential connection with the first transistor.

[A14] The semiconductor device of any one of A5 to A13, further including: a first transistor region installed on the main surface; a second transistor region installed on the main surface at an interval from the first transistor region; and a region separation structure formed on the main surface to electrically separate the first transistor region from other regions and electrically separate the second transistor region from other regions, wherein the first transistor is formed in the first transistor region, and wherein the second transistor is formed in the second transistor region.

[A15] The semiconductor device of any one of A5 to A13, further including: a transistor region installed on the main surface; and a region separation structure formed on the main surface so as to electrically separate the transistor region from other regions, wherein the first transistor is formed in the transistor region, and wherein the second transistor is formed in the transistor region.

[A16] The semiconductor device of A14 or A15, wherein the second gate electrode is formed at an interval from the first gate electrode.

[A17] The semiconductor device of A14 or A15, wherein the second gate electrode is integrally formed with the first gate electrode.

[A18] The semiconductor device of any one of A1 to A17, further including: a constant current source that is formed in a region different from a region of the first transistor in the chip and is electrically connected to the first transistor.

[A19] The semiconductor device of any one of A1 to A18, further including: a current mirror circuit that is formed in a region different from a region of the first transistor in the chip and is electrically connected to the first transistor.

[A20] The semiconductor device of any one of A1 to A19, wherein the first transistor is composed of an enhancement type or a depletion type.

Although the embodiments of the present disclosure have been described in detail, these are merely specific examples used for clarifying the technical contents of the present disclosure, the present disclosure should not be construed as being limited to these specific examples, and the scope of the present disclosure is limited by the accompanying claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a chip including a main surface; and a first transistor formed in the chip, wherein the first transistor includes:
a first drain region of a first conductive type that is formed on a surface layer portion of the main surface;
a first source region of the first conductive type that is formed on the surface layer portion of the main surface at an interval from the first drain region and a first channel region having a first channel length L1 in a region between the first source region and the first drain region; a first gate insulating film that covers the first channel region;
a first gate electrode that contains polysilicon and is formed on the first gate insulating film; a first region of the first conductive type that is formed in a peripheral portion of the first gate electrode; and a second region of a second conductive type that is formed in an inner portion of the first gate electrode and has a first gate length LG1 equal to or larger than the first channel length L1 (L1≤LG1), wherein the first region entirely surrounds the inner portion of the first gate electrode in a plan view, and wherein the second region is entirely surrounded by the first region in a plan view.

2. The semiconductor device of claim 1, wherein the first region faces the first drain region and the first source region with the first gate insulating film interposed therebetween, and wherein the second region faces the first channel region with the first gate insulating film interposed therebetween.

3. The semiconductor device of claim 1, wherein the first region does not face the first channel region.

4. The semiconductor device comprising:
a chip including a main surface;
a first transistor formed in the chip; and
a second transistor that is formed in a region different from a region of the first transistor in the chip,
wherein the first transistor includes:
a first drain region of a first conductive type that is formed on a surface layer portion of the main surface;
a first source region of the first conductive type that is formed on the surface layer portion of the main surface at an interval from the first drain region and a first channel region having a first channel length L1 in a region between the first source region and the first drain region;
a first gate insulating film that covers the first channel region;
a first gate electrode that contains polysilicon and is formed on the first gate insulating film;
a first region of the first conductive type that is formed in a peripheral portion of the first gate electrode; and
a second region of a second conductive type that is formed in an inner portion of the first gate electrode and has a first gate length LG1 equal to or larger than the first channel length L1 (L1≤LG1),
wherein the first region entirely surrounds the inner portion of the first gate electrode in a plan view,
wherein the second region is entirely surrounded by the first region in a plan view; and
wherein the second transistor includes:
a second drain region of the first conductive type that is formed on the surface layer portion of the main surface;
a second source region of the first conductive type that is formed on the surface layer portion of the main surface at an interval from the second drain region and a second channel region having a second channel length L2 in a region between the second source region and the second drain region;
a second gate insulating film that covers the second channel region;
a second gate electrode that contains polysilicon and is formed on the second gat e insulating film; and
a third region of the second conductive type that is formed in an inner portion of the second gate electrode and has a second gate length LG2 equal to or larger than the second channel length L2 (L2≤LG2).

5. The semiconductor device of claim 4, wherein the first transistor has a first gate threshold voltage Vth1, and
wherein the second transistor has a second gate threshold voltage Vth2 different from the first gate threshold voltage Vth1 (Vth1≠Vth2).

6. The semiconductor device of claim 4, wherein the second channel length L2 is equal to or smaller than the first gate length LG1 (L2≤LG1).

7. The semiconductor device of claim 4, wherein the second gate length LG2 is equal to or larger than the first channel length L1 (L1≤LG2).

8. The semiconductor device of claim 4, wherein the second gate length LG2 is equal to or larger than the first gate length LG1 (LG1≤LG2).

9. The semiconductor device of claim 4, wherein the second channel length L2 is substantially equal to the first channel length L1 (L1≈L2).

10. The semiconductor device of claim 4, wherein the third region is formed over an entire region of the second gate electrode.

11. The semiconductor device of claim 4, wherein the second transistor is electrically connected to the first transistor.

12. The semiconductor device of claim 4, wherein the second transistor forms differential connection with the first transistor.

13. The semiconductor device of claim 4, further including:
a first transistor region installed on the main surface;
a second transistor region installed on the main surface at an interval from the first transistor region; and
a region separation structure formed on the main surface to electrically separate the first transistor region from other regions and electrically separate the second transistor region from other regions,
wherein the first transistor is formed in the first transistor region, and
wherein the second transistor is formed in the second transistor region.

14. The semiconductor device of claim 4, further including:
a device region installed on the main surface; and
a region separation structure formed on the main surface to electrically separate the device region from other regions,
wherein the first transistor is formed in the device region, and
wherein the second transistor is formed in the device region.

15. The semiconductor device of claim 13, wherein the second gate electrode is formed at an interval from the first gate electrode.

16. The semiconductor device of claim 13, wherein the second gate electrode is integrally formed with the first gate electrode.

17. The semiconductor device of claim 1, further comprising a constant current source that is formed in a region different from a region of the first transistor in the chip and is electrically connected to the first transistor.

18. The semiconductor device of claim 1, further comprising a current mirror circuit that is formed in a region different from a region of the first transistor in the chip and is electrically connected to the first transistor.

19. The semiconductor device of claim 1, wherein the first transistor is composed of an enhancement type or a depletion type.

* * * * *